US012610703B2

(12) United States Patent
Woo et al.

(10) Patent No.: US 12,610,703 B2
(45) Date of Patent: Apr. 21, 2026

(54) DISPLAY PANEL AND ELECTRONIC DEVICE INCLUDING THE SAME

(71) Applicant: Samsung Display Co., Ltd., Yongin-si (KR)

(72) Inventors: Minwoo Woo, Seoul (KR); Wangwoo Lee, Osan-si (KR); Sungho Kim, Suwon-si (KR); Jinsung An, Gwacheon-si (KR); Seunghyun Lee, Asan-si (KR); Kyeongwoo Jang, Seoul (KR); Hyeri Cho, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 599 days.

(21) Appl. No.: 18/098,954

(22) Filed: Jan. 19, 2023

(65) Prior Publication Data

US 2023/0247875 A1 Aug. 3, 2023

(30) Foreign Application Priority Data

Jan. 26, 2022 (KR) ........................ 10-2022-0011364

(51) Int. Cl.
*H10K 59/131* (2023.01)
*H10K 59/80* (2023.01)

(52) U.S. Cl.
CPC ....... *H10K 59/131* (2023.02); *H10K 59/8791* (2023.02)

(58) Field of Classification Search
CPC ......................... H10K 59/131; H10K 59/8791
USPC ........................................................ 313/500
See application file for complete search history.

(56) References Cited

U.S. PATENT DOCUMENTS

| | | | |
|---|---|---|---|
| 9,093,660 B2 | 7/2015 | Yang et al. | |
| 11,751,463 B2 | 9/2023 | Choi et al. | |
| 2020/0365674 A1* | 11/2020 | Jeon ................... | H10K 59/1201 |
| 2021/0202900 A1 | 7/2021 | Lee | |
| 2021/0263606 A1 | 8/2021 | Lee | |

FOREIGN PATENT DOCUMENTS

| | | |
|---|---|---|
| KR | 10-1480928 | 1/2015 |
| KR | 10-2021-0081572 A | 7/2021 |
| KR | 10-2021-0086888 | 7/2021 |
| KR | 10-2021-0109078 | 9/2021 |

* cited by examiner

*Primary Examiner* — James R Greece
*Assistant Examiner* — Hana S Featherly
(74) *Attorney, Agent, or Firm* — Sughrue Mion, PLLC

(57) ABSTRACT

A display panel includes a base layer including a component area, a circuit layer disposed on the base layer, and a light emitting device layer including a first light emitting device disposed in the component area. The circuit layer includes first conductive patterns each extending in a first direction, at least one first intermediate insulating layer disposed on the first conductive patterns, and second conductive patterns disposed on the at least one first intermediate insulating layer and each extending in a second direction intersecting the first direction. Each of the first conductive patterns and the second conductive patterns overlap the first light emitting device in a plan view.

20 Claims, 12 Drawing Sheets

DD 300
200

DR3
DR2 ⊗ →DR1

110  120  130  140

100

DISPLAY PANEL AND ELECTRONIC DEVICE INCLUDING THE SAME

CROSS-REFERENCE TO RELATED APPLICATIONS

This application claims priority to and benefits of Korean Patent Application No. 10-2022-0011364 under 35 U.S.C. § 119, filed on Jan. 26, 2022 in the Korean Intellectual Property Office, the entire contents of which are incorporated herein by reference.

BACKGROUND

1. Technical Field

Embodiments of the disclosure described herein relate to a display panel including a display area through which a light signal passes, and an electronic device including the same.

2. Description of the Related Art

An electronic device may include various electronic parts such as a display panel and an electronic module. The electronic module may include a camera, an infrared detection sensor, a proximity sensor, and/or the like. The electronic module may be disposed under the display panel. The transmittance of a partial area of the display panel may be higher than the transmittance of another partial area of the display panel. Through an area of high transmittance, the electronic module may receive a light signal or may transmit a light signal.

For example, the electronic module may refer to a sensor (e.g., a camera module or a proximity sensor) that measures a distance between an object and a smartphone, a sensor that recognizes a part (e.g., a fingerprint, an iris, or a face) of the user's body, or the like. An operation of the electronic module may be affected by an inner structure of the display panel. There is continuing study on the inner structure of the display panel for the purpose of improving the reliability of the electronic module.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the disclosure provide a display panel capable of reducing distortion of a light signal.

Embodiments of the disclosure provide an electronic device including the display panel.

According to an embodiment, a display panel may include a base layer including a component area, a circuit layer disposed on the base layer, and a light emitting device layer including a first light emitting device disposed in the component area. The circuit layer may include first conductive patterns each extending in a first direction, at least one first intermediate insulating layer disposed on the first conductive patterns, and second conductive patterns disposed on the at least one first intermediate insulating layer and each extending in a second direction intersecting the first direction. Each of the first conductive patterns and the second conductive patterns may overlap the first light emitting device in a plan view.

In an embodiment, the circuit layer may further include at least one second intermediate insulating layer disposed on the second conductive patterns, and a third conductive pattern disposed on the at least one second intermediate insulating layer. Each of the first conductive patterns and the second conductive patterns may overlap the third conductive pattern in a plan view.

In an embodiment the first light emitting device may include a first pixel electrode disposed in the component area, the component area may include a device area overlapping the first pixel electrode and a transparent area not overlapping the first pixel electrode, and the first conductive patterns, the second conductive patterns, and the third conductive pattern may overlap the first pixel electrode and may not overlap the transparent area.

In an embodiment the circuit layer may further include a barrier layer disposed on the base layer and including an inorganic material, a buffer layer disposed on the barrier layer, a first insulating layer disposed on the buffer layer, a second insulating layer disposed on the first insulating layer, and a third insulating layer disposed on the second insulating layer. The at least one first intermediate insulating layer may include the buffer layer and the first insulating layer, the at least one second intermediate insulating layer may include the second insulating layer, and the first conductive patterns may be interposed between the barrier layer and the buffer layer. The second conductive patterns may be interposed between the first insulating layer and the second insulating layer, and the third conductive pattern may be interposed between the second insulating layer and the third insulating layer.

In an embodiment, the barrier layer may include at least one of a silicon oxide layer, a silicon oxynitride layer, a silicon nitride layer, and an amorphous silicon layer.

In an embodiment the circuit layer may further include a barrier layer disposed on the base layer and including an inorganic material, a buffer layer disposed on the barrier layer, a first insulating layer disposed on the buffer layer, a second insulating layer disposed on the first insulating layer, a third insulating layer disposed on the second insulating layer, and a fourth insulating layer disposed on the third insulating layer. The at least one first intermediate insulating layer may include the second insulating layer, the first conductive patterns may be interposed between the first insulating layer and the second insulating layer, and the second conductive patterns may be interposed between the second insulating layer and the third insulating layer.

In an embodiment, the first conductive patterns may be spaced from each other in the second direction as much as a first spacing, and the first spacing may be in a range of plural micrometers to tens of micrometers.

In an embodiment the second conductive patterns may be spaced from each other in the first direction as much as a second spacing, and the second spacing may be in a range of plural micrometers to tens of micrometers.

In an embodiment, the base layer may further include an intermediate area adjacent to the component area, the light emitting device layer may further include a second light emitting device including a second pixel electrode disposed in the intermediate area, the circuit layer may further include a first pixel circuit and a second pixel circuit, each of which may be disposed in the intermediate area, the first pixel circuit may be electrically connected with the first pixel electrode, and the second pixel circuit may be electrically connected with the second pixel electrode.

In an embodiment, the base layer may further include a main display area adjacent to the intermediate area, the light emitting device layer may further include a third light emitting device including a third pixel electrode disposed in the main display area, the circuit layer may further include a third pixel circuit disposed in the main display area, and the third pixel circuit may be electrically connected with the third pixel electrode.

In an embodiment, the first direction may be perpendicular to the second direction in a plan view.

According to an embodiment, a display panel may include a base layer, a circuit layer disposed on the base layer, and a light emitting device layer disposed on the circuit layer. The circuit layer may include first conductive patterns each extending in a first direction on the base layer, at least one first intermediate insulating layer covering the first conductive patterns, second conductive patterns disposed on the at least one first intermediate insulating layer and each extending in a second direction intersecting the first direction, at least one second intermediate insulating layer covering the second conductive patterns, and a third conductive pattern disposed on the at least one second intermediate insulating layer. Each of the second conductive patterns may intersect the first conductive patterns in a plan view, and each of the first conductive patterns and the second conductive patterns may overlap the third conductive pattern in a plan view.

In an embodiment, the base layer may include a component area including a device area and a transparent area through which a light passes, the light emitting device layer may include a first light emitting device overlapping the device area, and the first conductive patterns, the second conductive patterns, and the third conductive pattern may be disposed in the device area.

In an embodiment, the first light emitting device may include a first pixel electrode, a pixel defining pattern exposing at least a portion of the first pixel electrode, a light emitting layer disposed on the first pixel electrode, and a second pixel electrode disposed on the light emitting layer. Each of the first pixel electrode, the pixel defining pattern, and the light emitting layer may overlap the device area and may not overlap the transparent area.

In an embodiment, the base layer may further include an intermediate area surrounding at least a portion of the component area, the light emitting device layer may further include a second light emitting device disposed in the intermediate area, and the circuit layer may further include a first pixel circuit disposed in the intermediate area and electrically connected with the first light emitting device, and a second pixel circuit disposed in the intermediate area and electrically connected with the second light emitting device.

In an embodiment, the base layer may further include a main display area surrounding at least a portion of the intermediate area, the light emitting device layer may further include a third light emitting device disposed in the main display area, and the circuit layer may further include a third pixel circuit disposed in the main display area and electrically connected with the third light emitting device.

In an embodiment, the first conductive patterns may be spaced from each other in the second direction as much as a first spacing, the second conductive patterns may be spaced from each other in the first direction as much as a second spacing, and each of the first spacing and the second spacing may be in a range of plural micrometers to tens micrometers.

According to an embodiment, an electronic device may include a base layer including a component area including a device area and a transparent area, a light emitting device layer including a first light emitting device overlapping the device area in a plan view, and a circuit layer including a first conductive pattern, a second conductive pattern, and a third conductive pattern, which may be insulated from each other, and interposed between the base layer and the light emitting device layer. The second conductive pattern may intersect the first conductive pattern in a plan view, the third conductive pattern may cover the first conductive pattern and the second conductive pattern in a plan view, and the first conductive pattern, the second conductive pattern, and the third conductive pattern may overlap the device area in a plan view.

In an embodiment, the electronic device may further include an electronic module overlapping the component area in a plan view.

In an embodiment, the base layer may further include an intermediate area adjacent to the component area and not overlapping the electronic module, the light emitting device layer may further include a second light emitting device disposed in the intermediate area, and the circuit layer may further include a first pixel circuit disposed in the intermediate area and electrically connected with the first light emitting device, and a second pixel circuit disposed in the intermediate area and electrically connected with the second light emitting device.

BRIEF DESCRIPTION OF THE DRAWINGS

The above and other aspects and features of the disclosure will become apparent by describing in detail embodiments thereof with reference to the accompanying drawings.

DETAILED DESCRIPTION OF THE EMBODIMENTS

Figure 1:
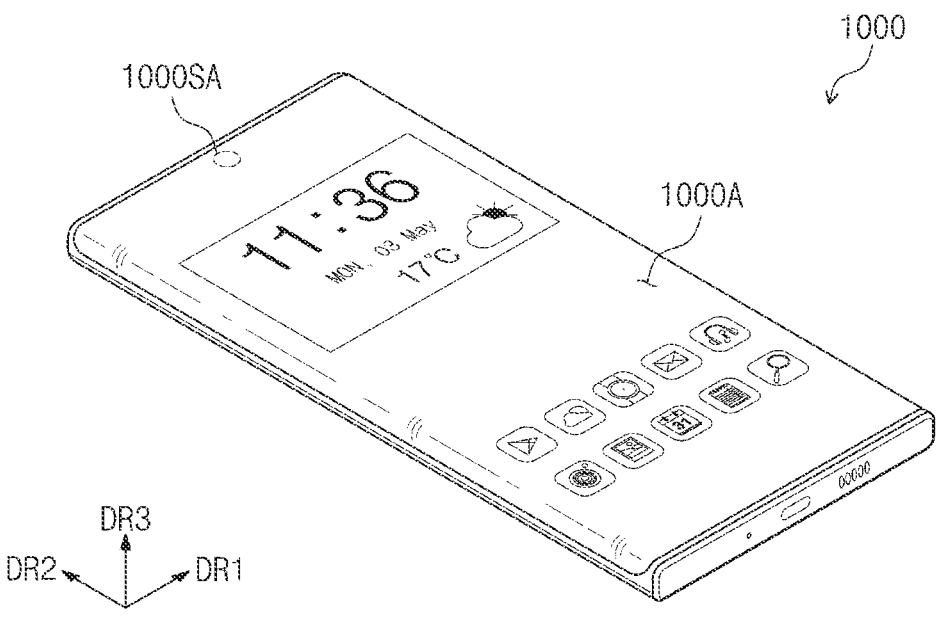
FIG. 1 is a schematic perspective view of an electronic device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

In the application, the expression that a first component (or area, layer, part, portion, etc.) is "on", "connected with", or "coupled to" a second component means that the first component is directly on, connected with, or coupled to the second component or means that a third component may be disposed therebetween.

The same reference numerals refer to the same components. In the drawings, thicknesses, proportions, and dimensions of components may be exaggerated to describe the technical features effectively.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

Although the terms "first", "second", etc. may be used to describe various components, the components should not be construed as being limited by the terms. The terms are only used to distinguish one component from another component. For example, without departing from the scope and spirit of the disclosure, a first component may be referred to as a "second component", and similarly, the second component may be referred to as the "first component".

The terms "under", "below", "on", "above", etc. are used to describe the correlation of components illustrated in drawings. The terms may be relative in concept and may be described based on a direction shown in drawings.

It will be further understood that the terms "comprises", "includes", "have", etc. specify the presence of stated features, numbers, steps, operations, elements, components, or a combination thereof but do not preclude the presence or addition of one or more other features, numbers, steps, operations, elements, components, or a combination thereof.

Unless otherwise defined, all terms (including technical terms and scientific terms) used in the specification have the same meaning as commonly understood by one skilled in the art to which the disclosure belongs. The terms such as terms defined in the dictionaries commonly used should be interpreted as having a meaning consistent with the meaning in the context of the related technology, and should not be interpreted in ideal or overly formal meanings unless explicitly defined herein.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

FIG. 1 is a schematic perspective view of an electronic device 1000 according to an embodiment of the disclosure.

Referring to FIG. 1, the electronic device 1000 may include a display device. An embodiment in which the electronic device 1000 is a mobile phone is illustrated in FIG. 1. However, the disclosure is not limited thereto. For example, the electronic device 1000 may be a tablet, a monitor, a television, an automotive navigation system, a game console, or a wearable device.

The electronic device 1000 may display an image through a display area 1000A. The display area 1000A may include a plane defined by a first direction DR1 and a second direction DR2. The display area 1000A may further include curved surfaces respectively bent from at least two sides of the plane. However, the shape of the display area 1000A is not limited thereto. For example, the display area 1000A may include only the plane. In other embodiments, the display area 1000A may further include four curved surfaces respectively bent from at least two or more sides of the plane, for example, four sides of the plane.

A portion of the display area 1000A may be defined as a sensing area 1000SA. One sensing area 1000SA is illustrated in FIG. 1 as an example, but the number of sensing areas is not limited to the example of FIG. 1. The sensing area 1000SA may be a portion of the display area 1000A but may have higher transmittance of a light signal than the remaining area of the display area 1000A. Accordingly, an image may be displayed through the sensing area 1000SA, and a light signal may be provided through the sensing area 1000SA.

The electronic device 1000 may include an electronic module disposed in an area overlapping the sensing area 1000SA. The electronic module may receive a light signal from the outside through the sensing area 1000SA or may output a light signal through the sensing area 1000SA. For example, the electronic module may refer to a sensor (e.g., a camera module or a proximity sensor) that measures a distance between an object and a smartphone, a sensor that recognizes a part (e.g., a fingerprint, an iris, or a face) of the user's body, or a small-sized lamp that outputs a light, but the disclosure is not limited thereto.

A thickness direction of the electronic device 1000 may be a third direction DR3 being a normal direction of the display area 1000A. Front surfaces (or upper surfaces) and rear surfaces (or lower surfaces) of members constituting the electronic device 1000 may be defined with respect to the third direction DR3.

Figure 2:
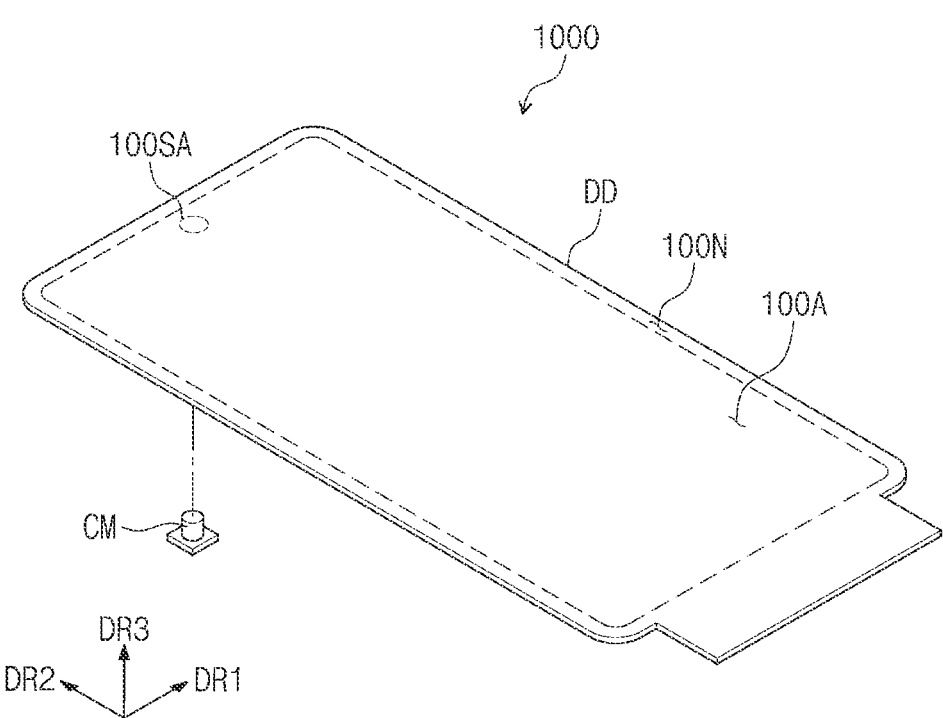
FIG. 2 is an exploded schematic perspective view illustrating some components of an electronic device according to an embodiment of the disclosure.

FIG. 2 is an exploded schematic perspective view illustrating some components of the electronic device 1000 according to an embodiment of the disclosure.

Referring to FIG. 2, the electronic device 1000 may include a display device DD and an electronic module CM. The display device DD may generate an image and may sense an external input. The electronic module CM may be disposed under the display device DD. In case that the display device DD is defined as a first electronic module constituting the electronic device 1000, the electronic module CM may be defined as a second electronic module. In an embodiment, the electronic module CM may be a camera module.

The display device DD may include a display area 100A and a peripheral area 100N. The display area 100A may correspond to the display area 1000A illustrated in FIG. 1. A partial area of the display device DD may be defined as a sensing area 100SA. The sensing area 100SA may have higher transmittance than the remaining area (hereinafter referred to as a "main display area") of the display area 100A. Accordingly, the sensing area 100SA may provide a natural light to the electronic module CM. The sensing area 100SA that may be a portion of the display area 100A may display an image.

A pixel PX (refer to FIG. 5) may be disposed in the display area 100A. Pixels PX may be disposed in each of the sensing area 100SA and the main display area. The pixels PX disposed in the sensing area 100SA and the pixels PX disposed in the main display area may be different in configuration. This will be described in detail later.

Figure 3:
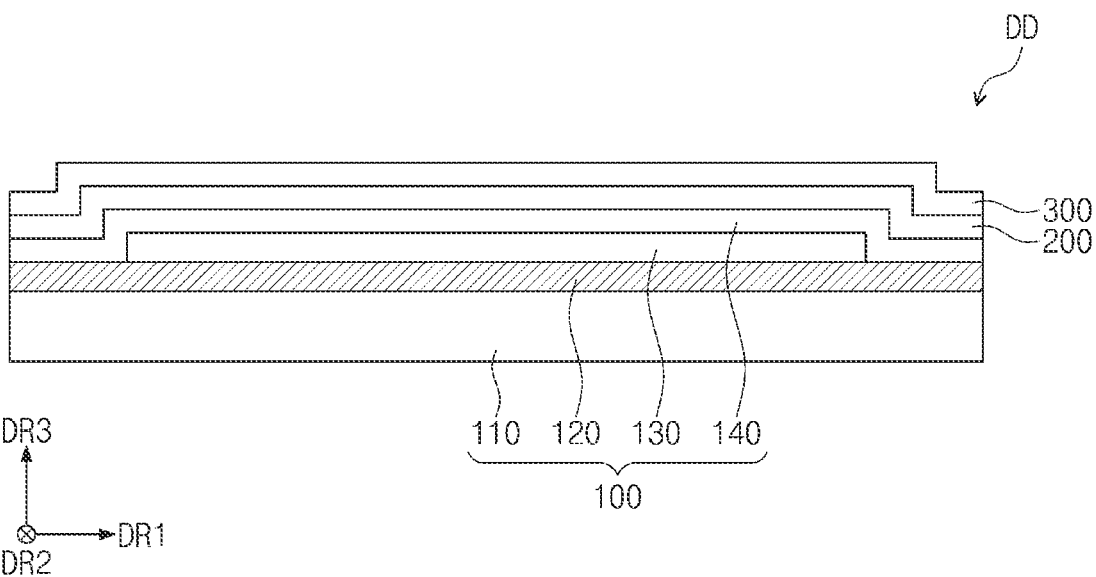
FIG. 3 is a schematic cross-sectional view of a display device according to an embodiment of the disclosure.

FIG. 3 is a schematic cross-sectional view of the display device DD according to an embodiment of the disclosure.

Referring to FIG. 3, the display device DD may include a display panel 100, a sensor layer 200, and an anti-reflection layer 300.

The display panel 100 may be a component that substantially generates an image. The display panel 100 may be a light emitting display panel. For example, the display panel 100 may be an organic light emitting display panel, an inorganic light emitting display panel, a quantum dot display panel, a micro-LED display panel, or a nano-LED display panel. The display panel 100 may be also referred to as a "display layer".

The display panel 100 may include abase layer 110, a circuit layer 120, alight emitting device layer 130, and an encapsulation layer 140.

The base layer 110 may be a member that provides a base surface on which the circuit layer 120 may be disposed. The base layer 110 may be a rigid substrate, or a flexible substrate allowing bending, folding, or rolling. The base layer 110 may be a glass substrate, a metal substrate, a polymer substrate, or the like. However, embodiments of the disclosure are not limited thereto. For example, the base layer 110 may be an inorganic layer, an organic layer, or a composite material layer.

The base layer 110 may have a multi-layer structure. For example, the base layer 110 may include a first synthetic resin layer, an inorganic layer of a multi-layer structure or a single-layer structure, and a second synthetic resin layer disposed on the inorganic layer of the multi-layer structure or the single-layer structure. Each of the first and second synthetic resin layers may include polyimide-based resin, but the disclosure is not limited thereto.

The circuit layer 120 may be disposed on the base layer 110. The circuit layer 120 may include an insulating layer, a semiconductor pattern, a conductive pattern, a signal line, and the like. An insulating layer, a semiconductor layer, and a conductive layer may be formed on the base layer 110 through a coating or deposition process, and the insulating layer, the semiconductor layer, and the conductive layer may be selectively patterned through multiple photolithography processes.

The light emitting device layer 130 may be disposed on the circuit layer 120. The light emitting device layer 130 may include a light emitting device. For example, the light emitting device may include an organic light emitting material, an inorganic light emitting material, an organic-inorganic light emitting material, a quantum dot, a quantum rod, a micro-LED, or a nano-LED.

The encapsulation layer 140 may be disposed on the light emitting device layer 130. The encapsulation layer 140 may protect the light emitting device layer 130 from foreign substances such as moisture, oxygen, and dust particles. The encapsulation layer 140 may include at least one inorganic layer. The encapsulation layer 140 may include a structure in which an inorganic layer, an organic layer, and an inorganic layer may be stacked on each other.

The sensor layer 200 may be disposed on the display panel 100. The sensor layer 200 may sense (or detect) an external input that is applied from the outside. The external input may be an input of the user. The user input may include various types of external inputs such as from a part of a body of the user, a light, a heat, a pen, or a pressure.

The sensor layer 200 may be formed on the display panel 100 through a successive process. The sensor layer 200 may be directly disposed on the display panel 100. The wording "being directly disposed" may indicate that a third component is not interposed between the sensor layer 200 and the display panel 100. For example, an adhesive member may not be separately interposed between the sensor layer 200 and the display panel 100.

The anti-reflection layer 300 may be directly disposed on the sensor layer 200. The anti-reflection layer 300 may reduce the reflectance of an external light incident from the outside of the display device DD. The anti-reflection layer 300 may be formed on the sensor layer 200 through a successive process. The anti-reflection layer 300 may include color filters. The color filters may have a given arrangement. For example, the color filters may be arranged in consideration of colors of lights emitted from pixels included in the display panel 100. Also, the anti-reflection layer 300 may further include a black matrix adjacent to the color filters. The anti-reflection layer 300 will be described in detail later.

According to an embodiment of the disclosure, the sensor layer 200 may be omitted. In this case, the anti-reflection layer 300 may be directly disposed on the display panel 100. In an embodiment of the disclosure, the locations of the sensor layer 200 and the anti-reflection layer 300 may be interchangeable.

Although not illustrated, in an embodiment of the disclosure, the display device DD may further include an optical layer that may be disposed on the anti-reflection layer 300. For example, the optical layer may be formed on the anti-reflection layer 300 through a successive process. The optical layer may improve the front luminance of the display device DD by controlling a direction of a light incident from the display panel 100. For example, the optical layer may include an organic insulating layer in which there may be defined openings respectively corresponding to emission areas of the pixels included in the display panel 100, and a high refraction layer filled in the openings together with covering the organic insulating layer. The high refraction layer may have a higher refractive index than the organic insulating layer.

Figure 4:
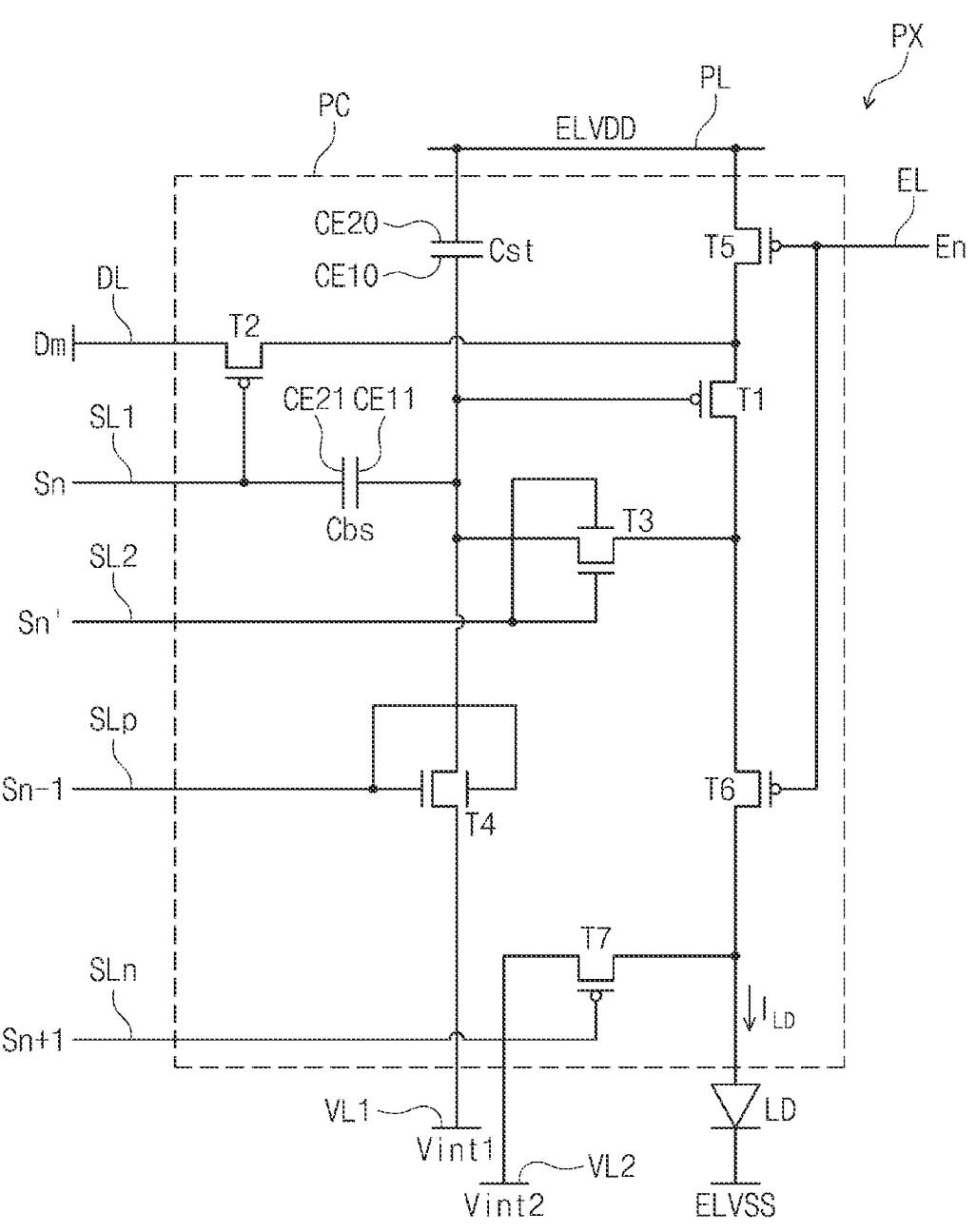
FIG. 4 is a schematic circuit diagram of a pixel according to an embodiment of the disclosure.

FIG. 4 is a schematic circuit diagram of the pixel PX according to an embodiment of the disclosure.

Referring to FIG. 4, the pixel PX may include a light emitting device LD and a pixel circuit PC. The light emitting device LD may be a component included in the light emitting device layer 130 of FIG. 3, and the pixel circuit PC may be a component included in the circuit layer 120 of FIG. 3.

The pixel circuit PC may include thin film transistors T1 to T7 and a storage capacitor Cst. The thin film transistors T1 to T7 and the storage capacitor Cst may be electrically connected with signal lines SL1, SL2, SLp, SLn, EL, and DL, a first initialization voltage line VL1, a second initialization voltage line VL2 (or an anode initialization voltage line), and a driving voltage line PL.

The thin film transistors T1 to T7 may include a driving thin film transistor T1 (or a first thin film transistor), a switching thin film transistor T2 (or a second thin film transistor), a compensation thin film transistor T3 (or a third thin film transistor), a first initialization thin film transistor T4 (or a fourth thin film transistor), an operation control thin film transistor T5 (or a fifth thin film transistor), an emission control thin film transistor T6 (or a sixth thin film transistor), and a second initialization thin film transistor T7 (or a seventh thin film transistor).

The light emitting device LD may include a first electrode (e.g., an anode electrode or a pixel electrode) and a second electrode (e.g., a cathode electrode or a common electrode), and the first electrode of the light emitting device LD may be connected with the driving thin film transistor T1 through the emission control thin film transistor T6 to receive a driving current $I_{LD}$, and the second electrode of the light emitting device LD may receive a low power supply voltage ELVSS. The light emitting device LD may generate a light of brightness corresponding to the driving current $I_{LD}$.

Some of the thin film transistors T1 to T7 may be implemented with an n-channel MOSFET (NMOS transistor), and the others thereof may be implemented with a p-channel MOSFET (PMOS transistor). For example, the compensation thin film transistor T3 and the first initialization thin film transistor T4 of the thin film transistors T1 to T7 may be implemented with an NMOS transistor, and the others thereof may be implemented with a PMOS transistor.

According to an embodiment of the disclosure, the compensation thin film transistor T3, the first initialization thin film transistor T4, and the second initialization thin film transistor T7 of the thin film transistors T1 to T7 may be implemented with an NMOS transistor, and the others thereof may be implemented with a PMOS transistor. According to an embodiment of the disclosure, one of the thin film transistors T1 to T7 may be implemented with an NMOS transistor, and the others thereof may be implemented with a PMOS transistor. According to an embodiment of the disclosure, all the thin film transistors T1 to T7 may be implemented with an NMOS transistor or a PMOS transistor.

The signal lines SL1, SL2, SLp, SLn, EL, and DL may include the first present scan line SL1 transferring a first scan signal Sn, the second present scan line SL2 transferring a second scan signal Sn', the prior scan line SLp transferring a previous scan signal Sn-1 to the first initialization thin film transistor T4, the emission control line EL transferring an emission control signal En to the operation control thin film transistor T5 and the emission control thin film transistor T6, the next scan line SLn transferring a next scan signal Sn+1 to the second initialization thin film transistor T7, and the data line DL transferring a data signal Dm while crossing the first present scan line SL1.

The driving voltage line PL may transfer a driving voltage ELVDD to the driving thin film transistor T1, and the first initialization voltage line VL1 may transfer an initialization voltage Vint1 for initializing the driving thin film transistor T1 and the first electrode of the light emitting device LD.

A gate of the driving thin film transistor T1 may be connected with the storage capacitor Cst, a source of the driving thin film transistor T1 may be connected with the driving voltage line PL through the operation control thin film transistor T5, and a drain of the driving thin film transistor T1 may be electrically connected with the first electrode of the light emitting device LD through the emission control thin film transistor T6. The driving thin film transistor T1 may receive the data signal Dm depending on a switching operation of the switching thin film transistor T2 and may supply the driving current $I_{LD}$ to the light emitting device LD.

A gate of the switching thin film transistor T2 may be connected with the first present scan line SL1 transferring the first scan signal Sn, a source of the switching thin film transistor T2 may be connected with the data line DL, and a drain of the switching thin film transistor T2 may be connected with a source of the driving thin film transistor T1 and may also be connected with the driving voltage line PL through the operation control thin film transistor T5. As the switching thin film transistor T2 may be turned on in response the first scan signal Sn from the first present scan line SL1, the switching thin film transistor T2 may perform a switching operation such that the data signal Dm transferred through the data line DL is provided to the source of the driving thin film transistor T1.

A gate of the compensation thin film transistor T3 may be connected with the second present scan line SL2. A drain of the compensation thin film transistor T3 may be connected with the drain of the driving thin film transistor T1 and may be connected with the first electrode of the light emitting device LD through the emission control thin film transistor T6. A source of the compensation thin film transistor T3 may be connected with a first capacitor electrode CE10 of the storage capacitor Cst and the gate of the driving thin film transistor T1. The source of the compensation thin film transistor T3 may be connected with the drain of the first initialization thin film transistor T4.

The compensation thin film transistor T3 may be turned on in response to the second scan signal Sn' received through the second present scan line SL2 to electrically connect the gate and the drain of the driving thin film transistor T1, for example, to diode-connect the driving thin film transistor T1.

A gate of the first initialization thin film transistor T4 may be connected with the prior scan line SLp. A source of the first initialization thin film transistor T4 may be connected with the first initialization voltage line VL1. The drain of the first initialization thin film transistor T4 may be connected with the first capacitor electrode CE10 of the storage capacitor Cst, the source of the compensation thin film transistor T3, and the gate of the driving thin film transistor T1. As the first initialization thin film transistor T4 may be turned on in response to the previous scan signal Sn-1 received through the prior scan line SLp, the first initialization thin film transistor T4 may perform an initialization operation such that the initialization voltage Vint1 is applied to the gate of the driving thin film transistor T1, for example, such that a voltage of the gate of the driving thin film transistor T1 is initialized.

A gate of the operation control thin film transistor T5 may be connected with the emission control line EL, a source of the operation control thin film transistor T5 may be connected with the driving voltage line PL, and a drain of the operation control thin film transistor T5 may be connected with the source of the driving thin film transistor T1 and the drain of the switching thin film transistor T2.

A gate of the emission control thin film transistor T6 may be connected with the emission control line EL, a source of the emission control thin film transistor T6 may be connected with the drain of the driving thin film transistor T1 and the drain of the compensation thin film transistor T3, and a drain of the emission control thin film transistor T6 may be electrically connected with a drain of the second initialization thin film transistor T7 and the first electrode of the light emitting device LD.

The operation control thin film transistor T5 and the emission control thin film transistor T6 are simultaneously turned on in response to the emission control signal En received through the emission control line EL, to transmit the driving voltage ELVDD to the light emitting device LD such that the driving current $I_{LD}$ flows to the light emitting device LD.

A gate of the second initialization thin film transistor T7 may be connected with the next scan line SLn, the drain of the second initialization thin film transistor T7 may be connected with the drain of the emission control thin film transistor T6 and the first electrode of the light emitting device LD, and a source of the second initialization thin film transistor T7 may be connected with the second initialization voltage line VL2 to receive an anode initialization voltage Vint2. The second initialization thin film transistor T7 may be turned on in response to the next scan signal Sn+1 transferred through the next scan line SLn and may initialize the first electrode of the light emitting device LD.

According to another embodiment, the second initialization thin film transistor T7 may be connected to the emission control line EL and driven in response to the emission control signal En. Locations of a source and a drain may be interchanged depending on a type (i.e., a p-type or n-type) of a transistor.

The storage capacitor Cst may include the first capacitor electrode CE10 and a second capacitor electrode CE20. The first capacitor electrode CE10 of the storage capacitor Cst is connected with the gate of the driving thin film transistor T1, and the second capacitor electrode CE20 of the storage capacitor Cst is connected with the driving voltage line PL. The storage capacitor Cst may store charges corresponding to a difference between a gate voltage of the driving thin film transistor T1 and the driving voltage ELVDD.

A boosting capacitor Cbs may include a first capacitor electrode CE11 and a second capacitor electrode CE21. The first capacitor electrode CE11 of the boosting capacitor Cbs may be connected with the first capacitor electrode CE10 of the storage capacitor Cst, and the second capacitor electrode CE21 of the boosting capacitor Cbs may be supplied with the first scan signal Sn. The boosting capacitor Cbs may compensate for a voltage drop of the gate of the driving thin film transistor T1 by increasing a voltage of the gate of the driving thin film transistor T1 at a point in time when the supply of the first scan signal Sn is stopped.

Hereinafter, an operation of each pixel PX according to an embodiment will be described in detail.

In case that the previous scan signal Sn−1 is supplied through the prior scan line SLp during an initialization period, the first initialization thin film transistor T4 is turned on in response to the previous scan signal Sn−1, and the driving thin film transistor T1 may be initialized by the initialization voltage Vint1 supplied from the first initialization voltage line VL1.

In case that the first scan signal Sn and the second scan signal Sn' are supplied through the first present scan line SL1 and the second present scan line SL2 during a data programming period, the switching thin film transistor T2 and the compensation thin film transistor T3 may be turned on in response to the first scan signal Sn and the second scan signal Sn'. The driving thin film transistor T1 may be diode-connected by the turned-on compensation thin film transistor T3 and may be biased forward.

According to the above bias condition, a compensation voltage Dm+Vth (Vth may be a negative (−) value), which may be obtained by subtracting a threshold voltage Vth of the driving thin film transistor T1 from the data signal Dm supplied from the data line DL, and may be applied to the gate of the driving thin film transistor T1.

As the driving voltage ELVDD and the compensation voltage Dm+Vth may be applied to opposite electrodes of the storage capacitor Cst, the storage capacitor Cst stores charges corresponding to the voltage difference between the opposite electrodes.

During an emission period, the operation control thin film transistor T5 and the emission control thin film transistor T6 may be turned on in response to the emission control signal En supplied from the emission control line EL. The driving current $I_{LD}$ may be generated depending on the difference between the gate voltage of the driving thin film transistor T1 and the driving voltage ELVDD and may be applied to the light emitting device LD through the emission control thin film transistor T6.

In an embodiment, at least one of the thin film transistors T1 to T7 may include a semiconductor layer including oxide, and the others thereof may include a semiconductor layer including silicon.

In detail, the driving thin film transistor T1 directly exerting an influence on the brightness of a display device may include a semiconductor layer formed of polycrystalline silicon, and thus, a high-resolution display device may be implemented.

Because carrier mobility of the oxide semiconductor may be high and a leakage current of the oxide semiconductor may be low, the voltage drop may not be significant even though the driving time may be long. For example, even during low-frequency driving, a color of an image may not be significantly changed by the voltage drop. This means that the low-frequency driving may be possible.

As described above, the oxide semiconductor may show a weak leakage current. Accordingly, as at least one of the compensation thin film transistor T3, the first initialization thin film transistor T4, and the second initialization thin film transistor T7 connected with the gate of the driving thin film transistor T1, employs the oxide semiconductor, the leakage current may be prevented from flowing into the gate thereof. For example, power consumption may decrease.

Figure 5:
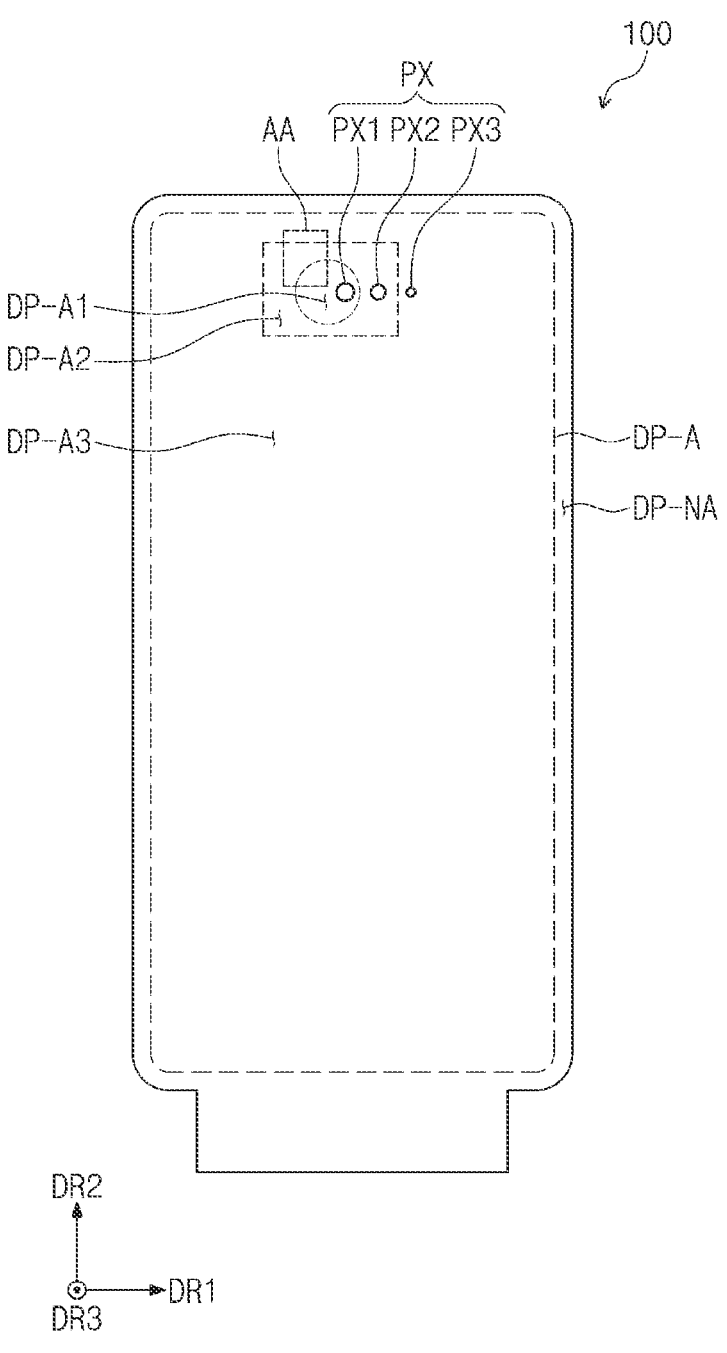
FIG. 5 is a schematic plan view of a display panel according to an embodiment of the disclosure.
Figure 6:
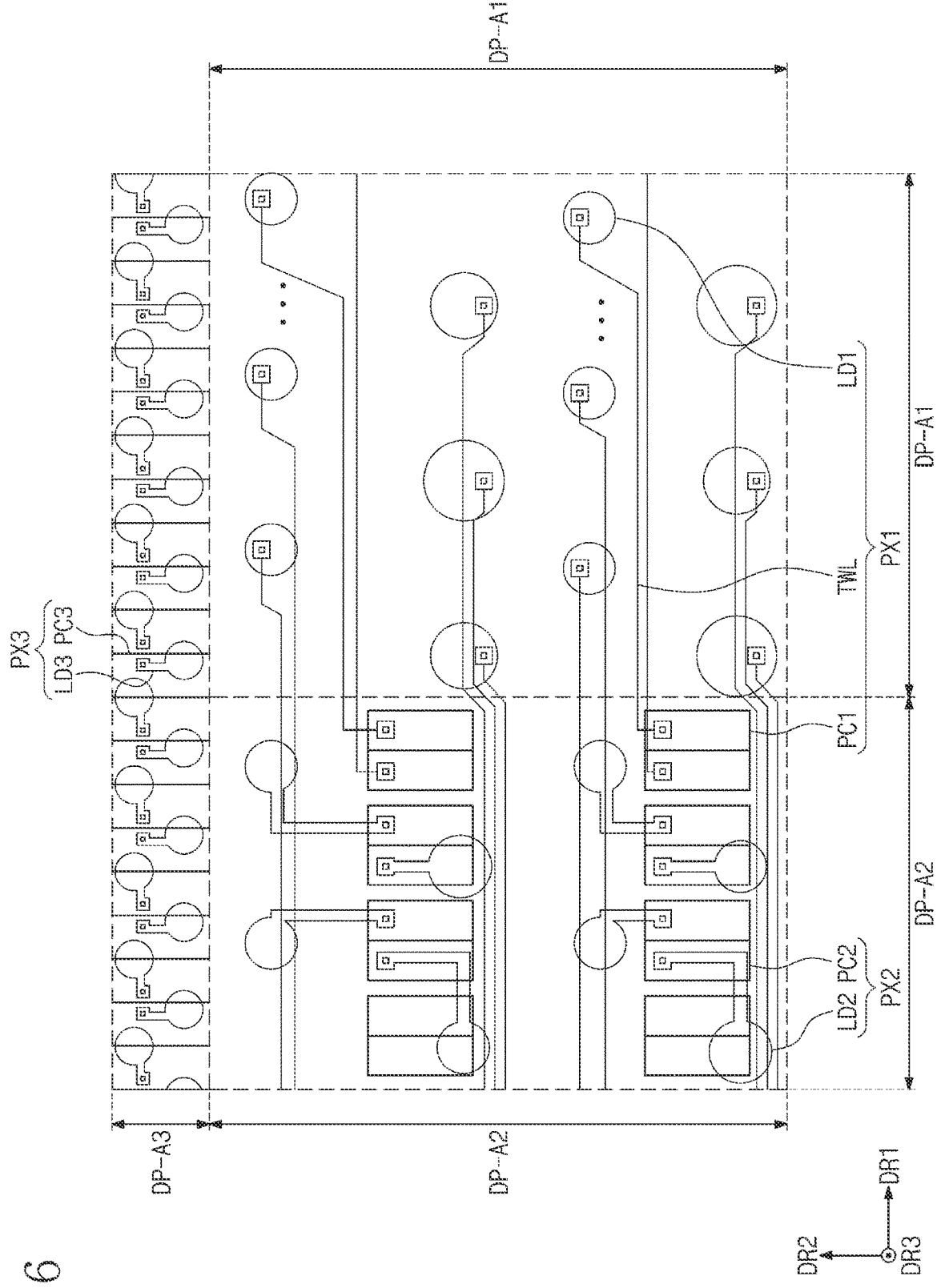
FIG. 6 is an enlarged schematic plan view of area AA of FIG. 5.

FIG. 5 is a schematic plan view of the display panel 100 according to an embodiment of the disclosure. FIG. 6 is an enlarged schematic plan view of area AA of FIG. 5.

Referring to FIGS. 5 and 6, the display panel 100 may include a display area DP-A and a peripheral area DP-NA. The peripheral area DP-NA may be adjacent to the display area DP-A and may surround at least a portion of the display area DP-A.

The display area DP-A may include a first area DP-A1, a second area DP-A2, and a third area DP-A3. The first area DP-A1 may be referred to as a "component area", the second area DP-A2 may be referred to as an "intermediate area" or a "transition area", and the third area DP-A3 may be referred to as a "normal display area" or a "main display area". The first area DP-A1 and the second area DP-A2 may be also referred to as an "assist display area".

The first area DP-A1, the second area DP-A2, and the third area DP-A3 may be distinguished from each other depending on light transmittance or resolution. The light transmittance and the resolution are measured within the criterion area.

The light transmittance of the first area DP-A1 may be higher than that of the second area DP-A2 and the third area DP-A3. The reason is that a ratio of the area occupied by a light blocking structure to be described later may be low in the first area DP-A1 compared to the second area DP-A2 and the third area DP-A3. The light blocking structure may include a conductive pattern, a pixel defining film, a pixel defining pattern, etc. of a circuit layer to be described later.

The resolution of the third area DP-A3 may be higher than that of the first area DP-A1 and the second area DP-A2. The number of pixels disposed in the third area DP-A3 per criterion area may be more than the number of pixels disposed in the first area DP-A1 or the second area DP-A2 per criterion area. In the third area DP-A3, more pixels may be disposed in the same area compared to the first area DP-A1 or the second area DP-A2.

In case that the first area DP-A1, the second area DP-A2, and the third area DP-A3 are distinguished from each other based on the light transmittance, the first area DP-A1 may be a first transmittance area, and the second area DP-A2 and the third area DP-A3 may be different portions of a second transmittance area distinguished from the first transmittance area. The transmittance of the second area DP-A2 may be substantially equal to the transmittance of the third area DP-A3. Even though the transmittance of the second area DP-A2 may be different from the transmittance of the third area DP-A3, because the transmittance of the first area DP-A1 may be considerably higher than the transmittance of the second area DP-A2 or the third area DP-A3, the second area DP-A2 and the third area DP-A3 may be defined as the second transmittance area in case that the first area DP-A1 is defined as the first transmittance area.

In case that the first area DP-A1, the second area DP-A2, and the third area DP-A3 are distinguished from each other based on the resolution, the first area DP-A1 and the second area DP-A2 may be a first resolution area, and the third area DP-A3 may be a second resolution area distinguished from the first resolution area.

The display panel 100 may include pixels PX. The display panel 100 may include a first pixel PX1 emitting a light in the first area DP-A1 from among the pixels PX, a second pixel PX2 emitting a light in the second area DP-A2 from among the pixels PX, and a third pixel PX3 emitting a light in the third area DP-A3 from among the pixels PX.

Multiple of each of the first pixel PX1, the second pixel PX2, and the third pixel PX3 may be provided. Each of the first to third pixels PX1, PX2, and PX3 may include a red pixel, a green pixel, and a blue pixel, and may further include a white pixel according to an embodiment.

The first pixel PX1 may include a first light emitting device LD1 and a first pixel circuit PC1 driving the first light emitting device LD1, the second pixel PX2 may include a second light emitting device LD2 and a second pixel circuit PC2 driving the second light emitting device LD2, and the third pixel PX3 may include a third light emitting device LD3 and a third pixel circuit PC3 driving the third light emitting device LD3. In FIG. 5, the first pixel PX1, the second pixel PX2, and the third pixel PX3 may be disposed to correspond to locations of the first to third light emitting devices LD1, LD2, and LD3.

The first area DP-A1 may overlap (or correspond to) the sensing area 1000SA illustrated in FIG. 1 or the sensing area 100SA illustrated in FIG. 1. For example, the first area DP-A1 may be provided in an area that overlaps the electronic module CM (refer to FIG. 2) in a plan view. For example, an external input (e.g., a light) may be provided to the electronic module CM through the first area DP-A1, and an output of the electronic module CM may be emitted to the outside through the first area DP-A1. In an embodiment, the first area DP-A1 is illustrated in the shape of a circle. However, the first area DP-A1 may have various shapes such as a polygonal shape, an oval shape, a figure having at least one curved side, or an atypical shape and is not limited to any one embodiment.

To secure the size of a transparent area, the number of pixels of the first area DP-A1 may be determined to be less than that of the third area DP-A3. A portion of the first area DP-A1, in which the first light emitting device LD1 is not disposed, may be defined as a transparent area TA (refer to FIG. 9). For example, a portion of the first area DP-A1, in which a first electrode AE1 (or a first pixel electrode) (refer to FIG. 9) of the first light emitting device LD1 and a pixel defining pattern PDP (refer to FIG. 9) surrounding the first electrode AE1 (refer to FIG. 9) are not disposed, may be defined as the transparent area TA (refer to FIG. 9).

The number of first pixels PX1 of the first area DP-A1 disposed in the unit area or the same area may be less than the number of third pixels PX3 of the third area DP-A3 disposed in the unit area or the same area. For example, the resolution of the first area DP-A1 may be about $\frac{1}{2}$, $\frac{3}{8}$, $\frac{1}{3}$, $\frac{1}{4}$, $\frac{2}{9}$, $\frac{1}{8}$, $\frac{1}{9}$ or $\frac{1}{16}$ of the resolution of the third area DP-A3. For example, the resolution of the third area DP-A3 may be about 400 ppi or more, and the resolution of the first area DP-A1 may be about 200 ppi or 100 ppi. This is only an example, and the disclosure is not limited thereto.

The first pixel circuit PC1 of the first pixel PX1 may not be disposed in the first area DP-A1. For example, the first pixel circuit PC1 may be disposed in the second area DP-A2 or the peripheral area DP-NA. The light transmittance of the first area DP-A1 may increase compared to the case where the first pixel circuit PC1 is disposed in the first area DP-A1.

The first light emitting device LD1 and the first pixel circuit PC1 may be electrically connected with each other through a connection line TWL. The connection line TWL may overlap the transparent area of the first area DP-A1. The connection line TWL may include a transparent conductive line. The transparent conductive line may include a transparent conductive material or a light-transmissive material. For example, the connection line TWL may be formed of a film of transparent conductive oxide (TCO) such as indium tin oxide (ITO), indium zinc oxide (IZO), indium gallium zinc oxide (IGZO), zinc oxide (ZnO) and/or indium oxide ($In_2O_3$).

The second area DP-A2 may be adjacent to the first area DP-A1. The second area DP-A2 may surround at least a portion of the first area DP-A1. The second area DP-A2 may refer to an area whose transmittance is lower than that of the first area DP-A1. In an embodiment, the second area DP-A2 may be spaced from the peripheral area DP-NA. However, the disclosure is not limited thereto. For example, the second area DP-A2 may be in contact with the peripheral area DP-NA.

The first pixel circuit PC1 of the first pixel PX1, the second light emitting device LD2, and the second pixel circuit PC2 may be disposed in the second area DP-A2. Because the second area DP-A2 may include the first pixel circuit PC1 and the second pixel circuit PC2, the light transmittance of the second area DP-A2 may be lower than the light transmittance of the first area DP-A1.

The third area DP-A3 may be adjacent to the second area DP-A2. The third area DP-A3 may be adjacent to the first area DP-A1. The third area DP-A3 may be defined as an area whose transmittance may be lower than that of the first area DP-A1. The third light emitting device LD3 and the third pixel circuit PC3 may be disposed in the third area DP-A3.

Although not illustrated in FIG. 6 in detail, to secure a distance from the third light emitting device LD3 disposed in the third area DP-A3, the first light emitting device LD1 of the first area DP-A1, which may be disposed the most adjacent to the third area DP-A3, may be in the shape of a circle in which a width in a specific direction may be larger than that in any other direction. For example, in the case where the first area DP-A1 is adjacent to the third area DP-A3 in the second direction DR2, a width of the first light emitting device LD1 in the first direction DR1 may be larger than a width of the first light emitting device LD1 in the second direction DR2.

Multiple of each of the first light emitting device LD1, the second light emitting device LD2, and the third light emitting device LD3 may be provided. A distance between two first light emitting devices being the most adjacent to each other from among the first light emitting devices LD1 may be greater than a distance between two third light emitting devices being the most adjacent to each other from among the third light emitting devices LD3. Also, a distance between two second light emitting devices being the most adjacent to each other from among the second light emitting devices LD2 may be greater than a distance between two third light emitting devices being the most adjacent to each other from among the third light emitting devices LD3.

The first, second, and third light emitting devices LD1, LD2, and LD3 may correspond to shapes of a first bottom electrode AE1 (refer to FIG. 9) of the first light emitting device LD1, a second bottom electrode AE2 (refer to FIG. 8) of the second light emitting device LD2, and a third bottom electrode AE3 (refer to FIG. 7) of the third light emitting device LD, in a plan view.

Figure 7:
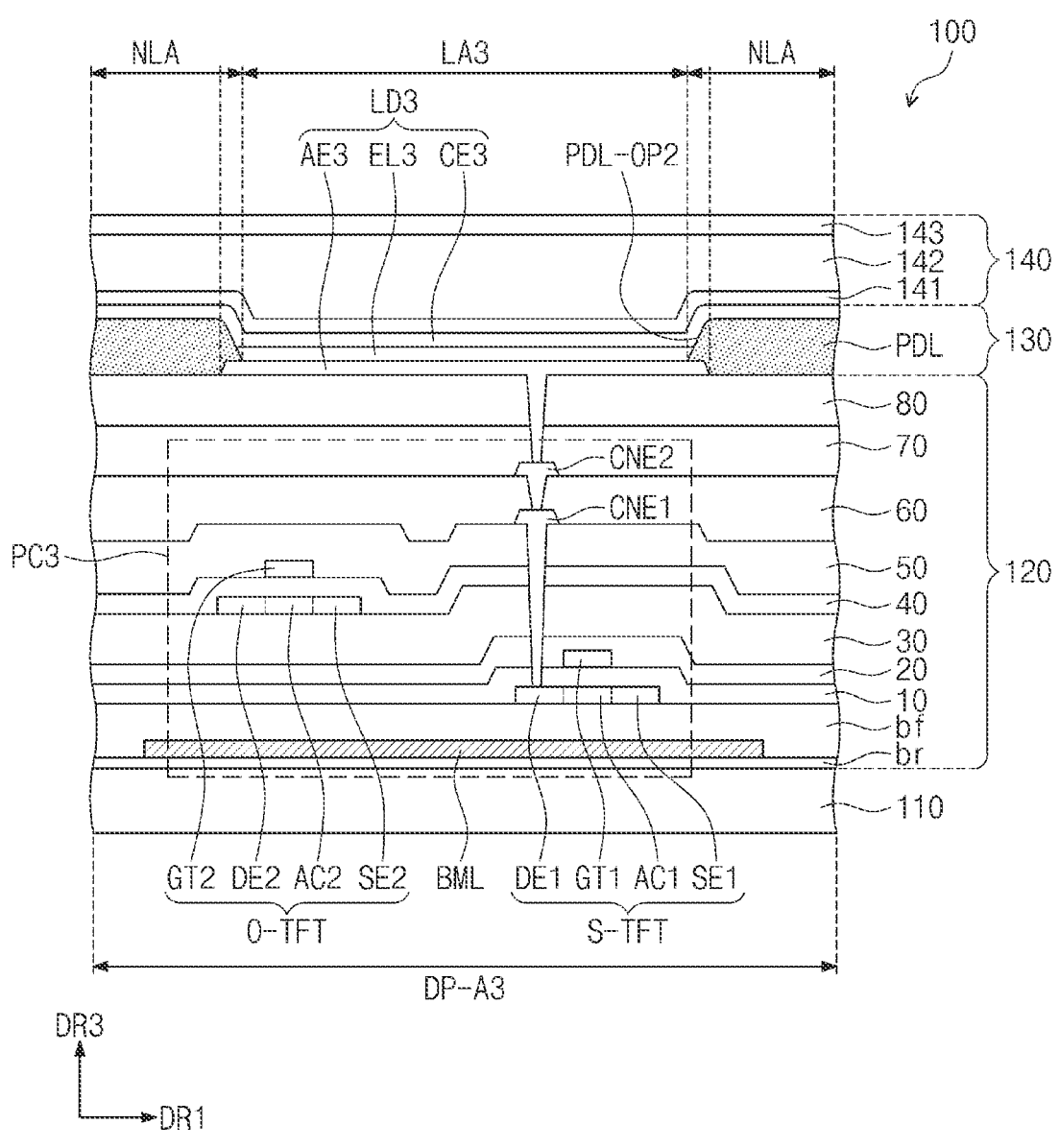
FIG. 7 is a schematic cross-sectional view of a display panel according to an embodiment of the disclosure.
Figure 8:
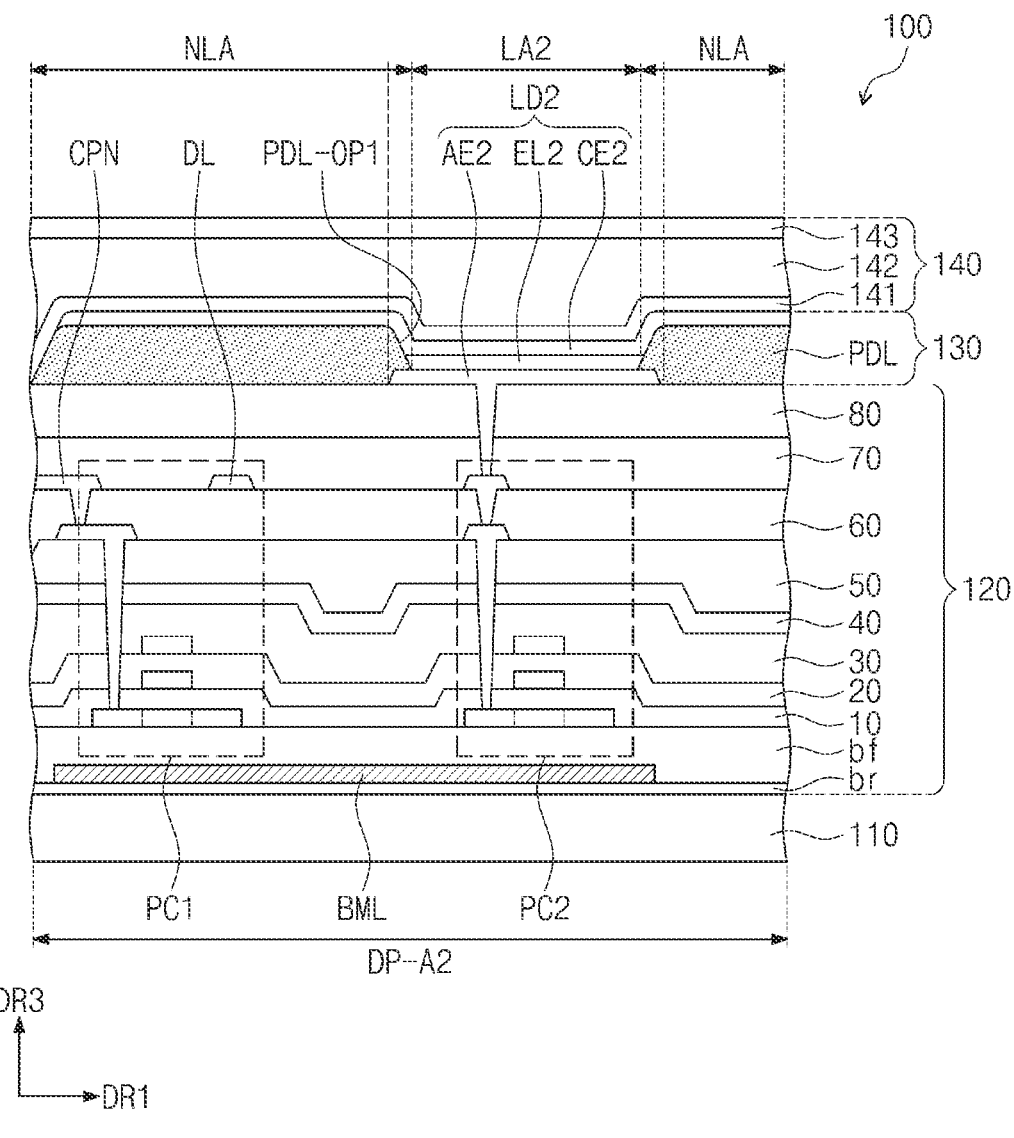
FIG. 8 is a schematic cross-sectional view of a display panel according to an embodiment of the disclosure.
Figure 9:
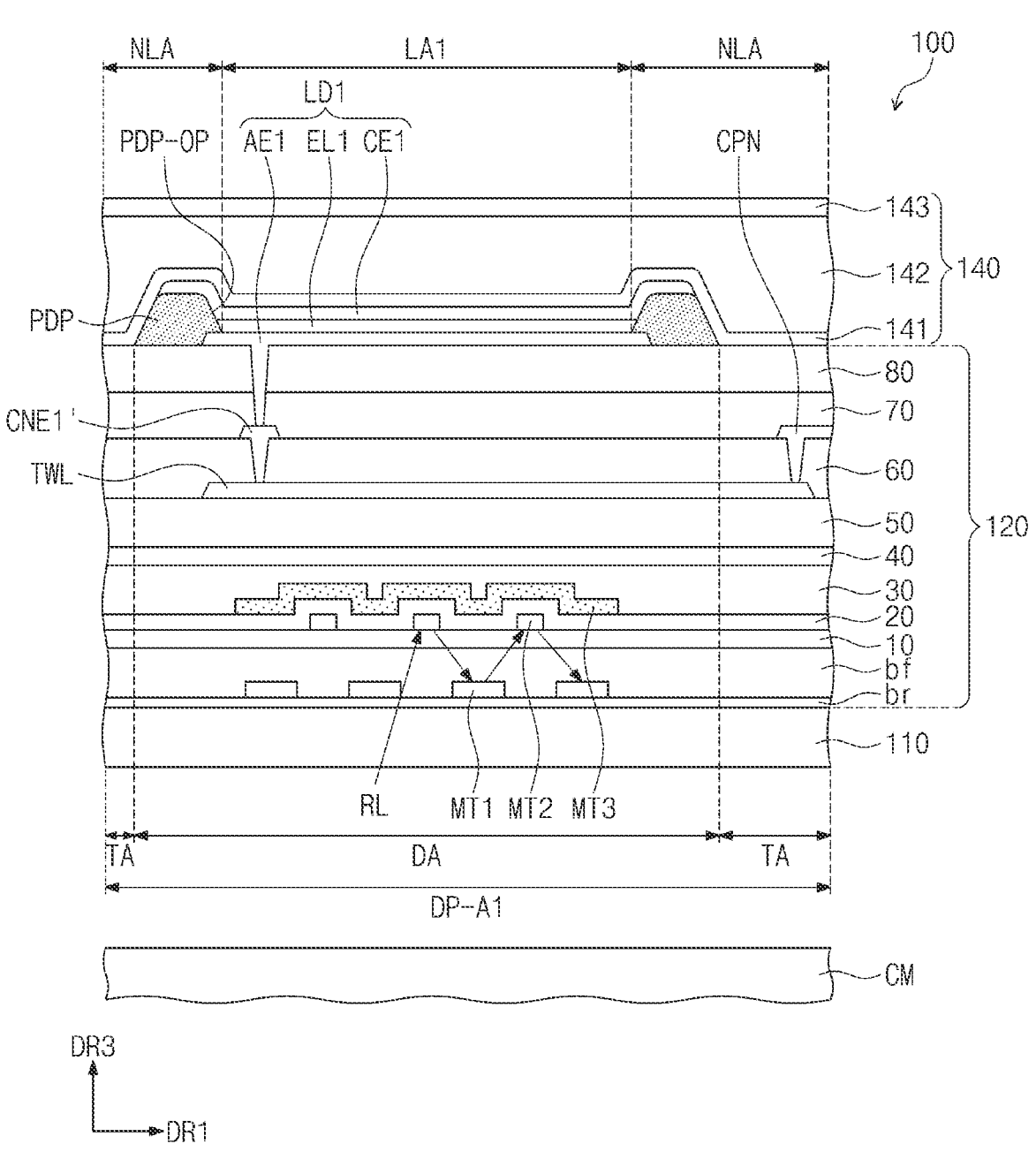
FIG. 9 is a schematic cross-sectional view of a display panel according to an embodiment of the disclosure.

FIGS. 7 to 9 are schematic cross-sectional views of the display panel 100 according to an embodiment of the disclosure.

FIG. 7 is a cross-sectional view of the third area DP-A3 being a main display area, FIG. 8 is a cross-sectional view of the second area DP-A2, and FIG. 9 is a cross-sectional view of the first area DP-A1.

Referring to FIGS. 7 to 9 together, the display panel 100 may include insulating layers, a semiconductor pattern, a conductive pattern, a signal line, and the like. The insulating layer, the semiconductor layer, and the conductive layer may be formed by a coating manner or a deposition manner. Afterwards, the insulating layer, the semiconductor layer, and the conductive layer may be selectively patterned through a photolithography manner. In such a manner, the semiconductor pattern, the conductive pattern, and the signal line included in the circuit layer 120 and the light emitting device layer 130 may be formed. Afterwards, the encapsulation layer 140 that covering the light emitting device layer 130 may be formed.

Referring to FIG. 7, a silicon thin film transistor S-TFT and an oxide thin film transistor O-TFT included in the third light emitting device LD3 and the third pixel circuit PC3 are illustrated in the third area DP-A3 of the display panel 100. In the equivalent circuit illustrated in FIG. 4, the third and fourth thin film transistors T3 and T4 may be implemented with the oxide thin film transistor O-TFT, and the remaining transistors may be implemented with the silicon thin film transistor S-TFT. The second light emitting device LD2, the second pixel circuit PC2, and the first pixel circuit PC1 are illustrated in FIG. 8. The first light emitting device LD1 is illustrated in FIG. 9.

In the display panel 100 according to an embodiment, the circuit layer 120 may be disposed on the base layer 110. The base layer 110 may have a multi-layer structure. For example, the base layer 110 may include a first synthetic resin layer, a silicon oxide (SiOx) layer disposed on the first synthetic resin layer, a silicon oxynitride (SiOn) layer disposed on the silicon oxide layer, and a second synthetic resin layer disposed on the silicon oxynitride layer. The silicon oxide layer and the silicon oxynitride layer may be referred to as a "base barrier layer". Each of the first and second synthetic resin layers may include polyimide-based resin. Also, each of the first and second synthetic resin layers may include at least one of acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin. In the specification, the wording "~~-based resin" indicates that "~~-based resin" includes the functional group of "~~".

A barrier layer br may be disposed on the base layer 110. The barrier layer br may have a multi-layer structure. For example, the barrier layer br may include a silicon oxide ($SiO_x$) layer, a silicon oxynitride ($SiO_yN_z$) layer, a silicon nitride ($SiN_w$) layer, and/or an amorphous silicon (a-Si) layer. For example, the barrier layer br may include the silicon oxide ($SiO_x$) layer and the amorphous silicon (a-Si) layer.

A buffer layer bf may be disposed on the barrier layer br. The buffer layer bf may prevent metal atoms or impurities from being spread into a semiconductor pattern from the base layer 110. The buffer layer bf may adjust the speed of applying heat during a crystallization process for forming the semiconductor pattern such that the semiconductor pattern may be uniformly formed.

In an embodiment, the semiconductor pattern may include a first semiconductor pattern and a second semiconductor pattern. The silicon thin film transistor S-TFT may be formed from the first semiconductor pattern, and the oxide thin film transistor O-TFT may be formed from the second semiconductor pattern. A back metal layer BML may be disposed under the silicon thin film transistor S-TFT and the oxide thin film transistor O-TFT. The back metal layer BML may be disposed to overlap the first to third pixel circuits PC1, PC2, and PC3. The back metal layer BML may block the influence of a polarization-based electrical potential on the first to third pixel circuits PC1, PC2, and PC3.

In an embodiment, the back metal layer BML may be interposed between the barrier layer br and the buffer layer bf In an embodiment of the disclosure, the back metal layer BML may be connected with an electrode or a line (or wire) and may receive a constant voltage or a signal therefrom. According to an embodiment of the disclosure, the back metal layer BML may be a floating electrode that may be isolated from another electrode or line.

The back metal layer BML may include a reflective metal. For example, the back metal layer BML may include at least one of silver (Ag), an alloy containing silver (Ag), molybdenum (Mo), an alloy containing molybdenum (Mo), aluminum (Al), an alloy containing aluminum (Al), an aluminum nitride (AlN), tungsten (W), tungsten nitride (WN), copper (Cu), and p+ doped amorphous silicon.

Although not illustrated separately, according to an embodiment of the disclosure, the back metal layer BML may be disposed under each of the silicon thin film transistor S-TFT and the silicon thin film transistor S-TFT, so as to be spaced therefrom. For example, the back metal layer BML may include a first back metal layer disposed under the silicon thin film transistor S-TFT and a second back metal layer disposed under the oxide thin film transistor O-TFT. For example, the first back metal layer may be interposed between the barrier layer br and the buffer layer bf, and the second back metal layer may be interposed between a second insulating layer 20 and a third insulating layer 30.

The first semiconductor pattern may be disposed on the buffer layer bf. The first semiconductor pattern may include a silicon semiconductor. For example, the silicon semiconductor may include amorphous silicon or polycrystalline silicon. For example, the first semiconductor pattern may include low-temperature polysilicon.

FIG. 7 shows only a portion of the first semiconductor pattern disposed on the buffer layer bf, and the first semiconductor pattern may be further disposed in another area. The first semiconductor patterns may be arranged across the pixels in compliance with a specific rule. An electrical property of the first semiconductor pattern may vary depending on whether it is doped. The first semiconductor pattern may include a first area whose conductivity may be high and a second area whose conductivity may be low. The first area may be doped with an N-type dopant or a P-type dopant. A P-type transistor may include a doping area doped with the P-type dopant, and an N-type transistor may include a doping area doped with the N-type dopant. The second area may be a non-doping area or may be an area doped at a lower concentration than the first area.

The conductivity of the first area may be higher than the conductivity of the second area, and the first area may substantially serve as an electrode or a signal line. The second area may substantially correspond to an active area (or channel) of a transistor. In other words, a portion of the first semiconductor pattern may be an active area of a transistor, another portion of the first semiconductor pattern may be a source area or a drain area of the transistor, and another portion of the first semiconductor pattern may be a connection electrode or a connection signal line.

A source area (or a source) SE1, an active area AC1, and a drain area (or a drain) DE1 of the silicon thin film transistor S-TFT may be formed from the first semiconductor pattern. The source area SE1 and the drain area DE1 may extend from the active area AC1 in directions opposite to each other, when viewed in a cross-sectional view.

A first insulating layer 10 may be disposed on the buffer layer bf. The first insulating layer 10 may overlap multiple pixels in common and may cover the first semiconductor pattern. The first insulating layer 10 may be an inorganic layer and/or an organic layer, and may have a single-layer or multi-layer structure. The first insulating layer 10 may include at least one of aluminum oxide, titanium oxide, silicon oxide, silicon nitride, silicon oxynitride, zirconium oxide, and hafnium oxide. In an embodiment, the first insulating layer 10 may be a single silicon oxide layer. As well as the first insulating layer 10, an insulating layer of the circuit layer 120 to be described later may be an inorganic layer and/or an organic layer, and may have a single-layer or multi-layer structure. The inorganic layer may include at least one of the materials described above but is not limited thereto.

A gate GT1 of the silicon thin film transistor S-TFT may be disposed on the first insulating layer 10. The gate GT1 may be a portion of a metal pattern. The gate GT1 may overlap the active area AC1. The gate GT1 may function as a mask in the process of doping the first semiconductor pattern. The gate GT1 may include at least one of, but is not limited thereto, titanium (Ti), silver (Ag), an alloy containing silver (Ag), molybdenum (Mo), an alloy containing molybdenum (Mo), aluminum (Al), an alloy containing aluminum (Al), an aluminum nitride (AlN), tungsten (W), a tungsten nitride (WN), copper (Cu), indium tin oxide (ITO), and indium zinc oxide (IZO).

The second insulating layer 20 may be disposed on the first insulating layer 10 and may cover the gate GT1. The third insulating layer 30 may be disposed on the second insulating layer 20.

The second semiconductor pattern may be disposed on the third insulating layer 30. The second semiconductor pattern may include an oxide semiconductor. The oxide semiconductor may include multiple areas that may be distinguished depending on whether the metal oxide may be reduced. An area (hereinafter referred to as a "reduction area") in which the metal oxide may be reduced has higher conductivity than an area (hereinafter referred to as a "non-reduction area") in which the metal oxide may not be reduced. The reduction area may substantially serve as a source/drain of a transistor or a signal line. The non-reduction area may substantially correspond to a semiconductor area (or a channel) of a transistor. In other words, a portion of the semiconductor pattern may be a semiconductor area of a transistor, another portion thereof may be a source/drain of the transistor, and the other portion thereof may be a signal transfer area.

A source area (or a source) SE2, an active area (or a channel) AC2, and a drain area (or a drain) DE2 of the oxide thin film transistor O-TFT may be formed from the second semiconductor pattern. The source area SE2 and the drain area DE2 may extend from the active area AC2 in directions opposite to each other, when viewed in a cross-sectional view.

A fourth insulating layer 40 may be disposed on the third insulating layer 30. The fourth insulating layer 40 may overlap the pixels in common and may cover the second semiconductor pattern. A gate GT2 of the oxide thin film transistor O-TFT is disposed on the fourth insulating layer 40. The gate GT2 of the oxide thin film transistor O-TFT may be a portion of a metal pattern. The gate GT2 of the oxide thin film transistor O-TFT may overlap the active area AC2.

A fifth insulating layer 50 may be disposed on the fourth insulating layer 40 and may cover the gate GT2. A first connection electrode CNE1 may be disposed on the fifth insulating layer 50. The first connection electrode CNE1 may be connected with the drain area DE1 of the silicon thin film transistor S-TFT through a contact hole penetrating the first to fifth insulating layers 10, 20, 30, 40, and 50.

A sixth insulating layer 60 may be disposed on the fifth insulating layer 50. A second connection electrode CNE2 may be disposed on the sixth insulating layer 60. The second connection electrode CNE2 may be connected with the first connection electrode CNE1 through a contact hole penetrating the sixth insulating layer 60. A seventh insulating layer 70 may be disposed on the sixth insulating layer 60 and may cover the second connection electrode CNE2. An eighth insulating layer 80 may be disposed on the seventh insulating layer 70.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may include general purpose polymers such as Benzocyclobutene (BCB), polyimide, Hexamethyldisiloxane (HMDSO), Polymethylmethacrylate (PMMA) or Polystyrene (PS), a polymer derivative having a phenolic group, an acrylic polymer, an imide-based polymer, an acryl ether polymer, an amide-based polymer, a fluorine-based polymer, a p-xylene-based polymer, a vinyl alcohol-based polymer, and the blend thereof.

The light emitting device layer 130 including the first to third light emitting devices LD1, LD2, and LD3 may be disposed on the circuit layer 120. The first light emitting device LD1 may include a first electrode (or a pixel electrode) AE1, a light emitting layer EL1, and a second electrode CE1; the second light emitting device LD2 may include a first electrode (or a pixel electrode) AE2, a light emitting layer EL2, and a second electrode CE2; and the third light emitting device LD3 may include a third electrode (or a pixel electrode) AE3, a light emitting layer EL3, and a second electrode CE3. There is illustrated an example in which the second electrodes CE1, CE2, and CE3 of the first light emitting device LD1, the second light emitting device LD2, and the third light emitting device LD3 are spaced from each other. However, the disclosure is not limited thereto. For example, the second electrodes CE1, CE2, and CE3 may be integrally formed and may be provided as a common electrode. The second electrodes CE1, CE2, and CE3 may overlap the transparent area TA in a plan view.

The first electrode AE1 of the first light emitting device LD1, the first electrode AE2 of the second light emitting device LD2, and the first electrode AE3 of the third light emitting device LD3 may be disposed on the eighth insulating layer 80. Each of the first electrode AE1 of the first light emitting device LD1, the first electrode AE2 of the second light emitting device LD2, and the first electrode AE3 of the third light emitting device LD3 may be a (semi-)transparent electrode or a reflective electrode. According to an embodiment of the disclosure, the first electrode AE1 of the first light emitting device LD1, the first electrode AE2 of the second light emitting device LD2, and the first electrode AE3 of the third light emitting device LD3 may include a reflective layer formed of Ag, Mg, Al, Pt, Pd, Au, Ni, Nd, Ir, Cr, or a compound thereof, and a transparent or semi-transparent electrode layer formed on the reflective layer. The transparent electrode layer or the semi-transparent electrode layer may include at least one selected from the group consisting of indium tin oxide (ITO), indium zinc oxide (IZO), indium gallium zinc oxide (IGZO), zinc oxide (ZnO) or indium oxide ($In_2O_3$), and aluminum doped zinc oxide (AZO). For example, each of the first electrode AE1 of the first light emitting device LD1, the first electrode AE2 of the second light emitting device LD2, and the first electrode AE3 of the third light emitting device LD3 may include a stacked structure of ITO/Ag/ITO.

A pixel defining layer PDL and the pixel defining pattern PDP may be disposed on the eighth insulating layer 80. The pixel defining layer PDL and the pixel defining pattern PDP may include the same material and may be formed through the same process. Each of the pixel defining layer PDL and the pixel defining pattern PDP may have a property of absorbing a light. For example, each of the pixel defining layer PDL and the pixel defining pattern PDP may have a black color. Each of the pixel defining layer PDL and the pixel defining pattern PDP may include a black coloring agent. The black coloring agent may include a black dye and a black pigment. The black coloring agent may include a metal, such as carbon black or chromium, or an oxide thereof. Each of the pixel defining layer PDL and the pixel defining pattern PDP may correspond to a light blocking pattern having a light blocking characteristic.

The pixel defining pattern PDP may be disposed in the first area DP-A1. The pixel defining pattern PDP may cover a portion of the first electrode AE1 of the first light emitting device LD1. For example, the pixel defining pattern PDP may cover a periphery of the first electrode AE1 of the first light emitting device LD1.

An opening PDP-OP that exposes the portion of the first electrode AE1 may be defined in the pixel defining pattern PDP. The portion of the first electrode AE1, which may be exposed through the opening PDP-OP, may be defined as a first light emitting area LA1. Multiple first light emitting areas LA1 may be provided so as to correspond to multiple first light emitting devices LD1, respectively. The first light emitting area may be adjacent to one or more non-emitting areas NLA.

The pixel defining layer PDL may be disposed in the second area DP-A2 and the third area DP-A3. The pixel defining layer PDL may cover a portion of the first electrode AE2 of the second light emitting device LD2 and a portion of the first electrode AE3 of the third light emitting device LD3. For example, a first opening PDL-OP1 exposing a portion of the first electrode AE2 of the second light emitting device LD2 and a second opening PDL-OP2 exposing a portion of the first electrode AE3 of the third light emitting device LD3 may be defined in the pixel defining layer PDL. The portion of the first electrode AE2 of the second light emitting device LD2, which may be exposed through the first opening PDL-OP1, may be defined as a second light emitting area LA2. The portion of the first electrode AE3 of the third light emitting device LD3, which may be exposed through the second opening PDL-OP2, may be defined as a third light emitting area LA3.

The pixel defining pattern PDP may increase a distance between an edge of the first electrode AE1 of the first light emitting device LD1 and the second electrode CE1, the pixel defining layer PDL may increase a distance between an edge of the first electrode AE2 of the second light emitting device LD2 and the second electrode CE2 and a distance between an edge of the first electrode AE3 of the third light emitting device LD3 and the second electrode CE3. Accordingly, the pixel defining pattern PDP and the pixel defining layer PDL may play a role in preventing an electric arc from occurring at the edges of the first electrodes AE1, AE2, and AE3.

A portion of the first area DP-A1, which overlaps the first electrode AE1 of the first light emitting device LD1 and a portion where the pixel defining pattern PDP may be disposed, may be defined as a device area DA, and the remaining portion thereof may be defined as the transparent area TA.

The first electrode AE1 of the first light emitting device LD1 may be electrically connected with the first pixel circuit PC1 disposed in the second area DP-A2. For example, the first electrode AE1 of the first light emitting device LD1 may be electrically connected with the first pixel circuit PC1 through the connection line TWL and connection electrodes CNE1' and CPN. The connection line TWL may overlap the transparent area TA. Accordingly, the connection line TWL may include a light transmissive material. According to an embodiment of the disclosure, the connection electrode CPN may be omitted; the connection line TWL may be directly connected with a conductive pattern of the first pixel circuit PC1.

The connection line TWL may be interposed between the fifth insulating layer 50 and the sixth insulating layer 60, but is not particularly limited thereto. The connection electrodes CNE1' and CPN may be interposed between the sixth insulating layer 60 and the seventh insulating layer 70.

The light emitting layer EL1 of the first light emitting device LD1 may be disposed on the first electrode AE1 of the first light emitting device LD1, the light emitting layer EL2 of the second light emitting device LD2 may be disposed on the first electrode AE2 of the second light emitting device LD2, and the light emitting layer EL3 of the third light emitting device LD3 may be disposed on the first electrode AE3 of the third light emitting device LD3. In an embodiment, each of the light emitting layers EL1, EL2, and EL3 may emit a light of at least one of a blue color, a red color, and a green color.

The second electrodes CE1, CE2, and CE3 may be respectively disposed on the light emitting layers EL1, EL2, and EL3.

Although not illustrated, hole control layers may be respectively interposed between the first electrodes AE1, AE2, and AE3 and the light emitting layers EL1, EL2, and EL3. The hole control layer may include a hole transport layer and may further include a hole injection layer. Electron control layers may be respectively interposed between the second electrodes CE1, CE2, and CE3 and the light emitting layers EL1, EL2, and EL3. The electron control layer may include an electron transport layer and may further include an electron injection layer. The hole control layer and the electron control layer may be formed in common in the pixels PX (see FIG. 5) by using an open mask.

The encapsulation layer 140 may be disposed on the light emitting device layer 130. The encapsulation layer 140 may include an inorganic layer 141, an organic layer 142, and an inorganic layer 143 that are sequentially stacked on each other, but layers constituting the encapsulation layer 140 are not limited thereto.

The inorganic layer 141 and the inorganic layer 143 may protect the light emitting device layer 130 from moisture and oxygen, and the organic layer 142 may protect the light emitting device layer 130 from a foreign substance such as dust particles. The inorganic layers 141 and 143 may include at least one of a silicon nitride layer, a silicon oxynitride layer, a silicon oxide layer, a titanium oxide layer, and an aluminum oxide layer. The organic layer 142 may include an acryl-based organic layer but is not limited thereto.

The electronic module CM disposed under the display panel 100 is additionally illustrated in FIG. 9. In a plan view, the electronic module CM may overlap the first area DP-A1. In detail, the electronic module CM may overlap a device area DA and the transparent area TA in a plan view.

Referring to FIG. 9, the display panel 100 of the disclosure may include a first conductive pattern MT1, a second conductive pattern MT2, and a third conductive pattern MT3 that are disposed in the first area DP-A1. In a plan view, the first to third conductive patterns MT1, MT2, and MT3 may overlap the device area DA and may not overlap the transparent area TA.

In a plan view, the first to third conductive patterns MT1, MT2, and MT3 may overlap the first light emitting device LD1, in detail, may overlap the first electrode AE1 of the first light emitting device LD1.

As the first to third conductive patterns MT1, MT2, and MT3 may be disposed in the device area DA, the light transmission and reception of the electronic module CM (refer to FIG. 2) through the transparent area TA may not be hindered.

In case that the first to third conductive patterns MT1, MT2, and MT3 are absent, a reflected light RL reflected from the electronic module CM may be reflected from a lower surface of the first electrode AE1 and may be incident onto the electronic module CM. The shape of the first electrode AE1 may be recognized by the electronic module CM. For example, in the case where the electronic module CM is a camera module, because the reflected light RL may be reflected from the lower surface of the first electrode AE1 and may be incident onto the electronic module CM, the ghost phenomenon that the shape of the first electrode AE1 is caught on a camera lens may occur. The reliability of the electronic module CM and the reliability of the electronic device 1000 including the electronic module CM may be reduced.

The display panel 100 of the disclosure may include the first to third conductive patterns MT1, MT2, and MT3 disposed under the first electrode AE1 such that a rough reflection interface may be provided to the reflected light RL and such that the amount of reflected light RL decreases or the reflected light RL may be trapped between the first to third conductive patterns MT1, MT2, and MT3. Accordingly, the amount of reflected light RL again incident onto the electronic module CM may be minimized, and the ghost phenomenon appearing in the electronic module CM may be alleviated. The user of the electronic device 1000 may visually perceive the subject clearly through the electronic module CM.

In an embodiment, the first conductive pattern MT1 may be interposed between the barrier layer br and the buffer layer bf. The first conductive pattern MT1 and the back metal layer BML (refer to FIG. 7) may include the same material and may be formed through the same process. The second conductive pattern MT2 may be interposed between the first insulating layer 10 and the second insulating layer 20. The second conductive pattern MT2 and the gate GT1 of the silicon thin film transistor S-TFT may include the same material and may be formed through the same process. The third conductive pattern MT3 may be interposed between the second insulating layer 20 and the third insulating layer 30.

In an embodiment, the first to third conductive patterns MT1, MT2, and MT3 may include a reflective metal. Each of the first and second conductive patterns MT1 and MT2 may independently include at least one of titanium (Ti), silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), indium tin oxide (ITO), and indium zinc oxide (IZO) but embodiments are not specifically limited thereto.

The third conductive pattern MT3 may include at least one of silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), titanium (Ti), and p+ doped amorphous silicon.

For example, each of the first to third conductive patterns MT1, MT2, and MT3 may be molybdenum (Mo). However, the disclosure is not limited thereto.

In a plan view, the first conductive pattern MT1 and the second conductive pattern MT2 may be disposed alternately, and the third conductive pattern MT3 may cover the first conductive pattern MT1 and the second conductive pattern MT2. As such, the reflected light RL may be prevented from being incident onto the first electrode AE1 through the first conductive pattern MT1 and the second conductive pattern MT2 and may be prevented from being again incident onto the electronic module CM. This will be described with reference to FIG. 10 together.

Figure 10:
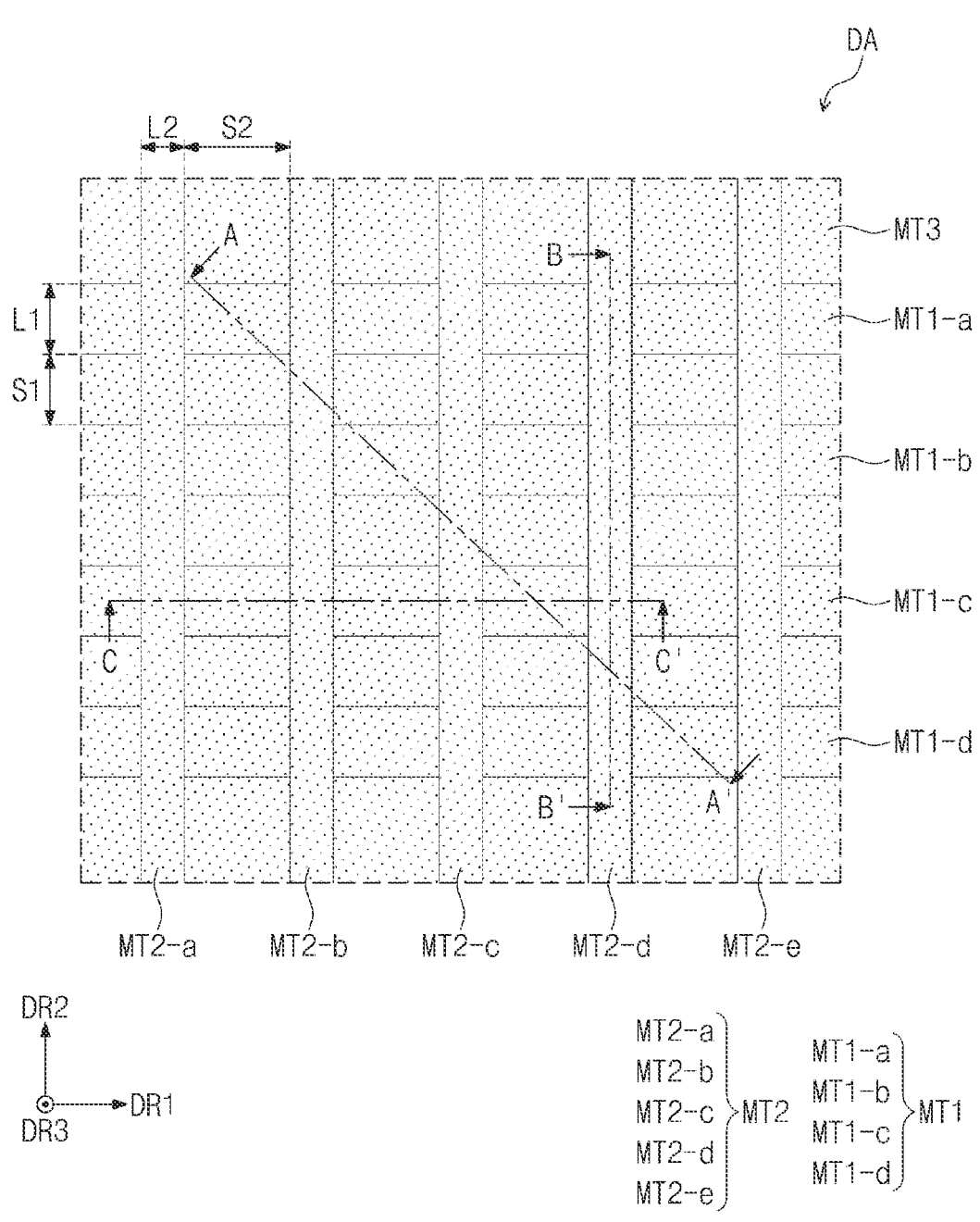
FIG. 10 is a schematic plan view of a device area according to an embodiment of the disclosure.

FIG. 10 is a schematic plan view of the device area DA according to an embodiment of the disclosure.

A plan view of the first to third conductive patterns MT1, MT2, and MT3 disposed in the device area DA is briefly illustrated in FIG. 10.

Referring to FIG. 10, the first conductive pattern MT1 and the second conductive pattern MT2 may cross each other in a plan view. For example, the first conductive pattern MT1 may extend in the first direction DR1, and the second conductive pattern MT2 may extend in the second direction DR2 intersecting the first direction DR1. In an embodiment, the first direction DR1 may be perpendicular to the second direction DR2. However, the disclosure is not limited thereto. For example, the second conductive pattern MT2 may extend in a direction that forms an angle being greater than 0° and less than 90° with the first direction DR1.

The first conductive pattern MT1 may include multiple first conductive patterns MT1-*a*, MT1-*b*, MT1-*c*, and MT1-*d* each extending in the first direction DR1. The first conductive patterns MT1-*a*, MT1-*b*, MT1-*c*, and MT1-*d* may be spaced from each other in the second direction DR2.

Each of the first conductive patterns MT1-*a*, MT1-*b*, MT1-*c*, and MT1-*d* may have a first width L1. The first width L1 may have a range of several micrometers. The first width L1 may refer to a length that is measured in the second direction DR2 being a direction perpendicular to an extending direction of the first conductive pattern MT1.

Separation spaces between the first conductive patterns MT1-*a*, MT1-*b*, MT1-*c*, and MT1-*d* may be uniform. For example, the first conductive patterns MT1-*a*, MT1-*b*, MT1-*c*, and MT1-*d* may be spaced from each other in the second direction DR2 as much as a first spacing S1. The first spacing S1 may have a range of several micrometers or more and several tens of micrometers or less.

The second conductive pattern MT2 may include multiple second conductive patterns MT2-*a*, MT2-*b*, MT2-*c*, MT2-*d*, and MT2-*e* each extending in the second direction DR2. The second conductive patterns MT2-*a*, MT2-*b*, MT2-*c*, MT2-*d*, and MT2-*e* may be spaced from each other in the first direction DR1.

Each of the second conductive patterns MT2-*a*, MT2-*b*, MT2-*c*, MT2-*d*, and MT2-*e* may have a second width L2. The second width L2 may have a range of several microm- eters. The second width L2 may refer to a length that is measured in the first direction DR1 being a direction per- pendicular to an extending direction of the second conduc- tive pattern MT2.

Separation spaces between the second conductive patterns MT2-*a*, MT2-*b*, MT2-*c*, MT2-*d*, and MT2-*e* may be uni- form. For example, the second conductive patterns MT2-*a*, MT2-*b*, MT2-*c*, MT2-*d*, and MT2-*e* may be spaced from each other in the first direction DR1 as much as a second spacing S2. The second spacing S2 may have a range of several micrometers or more and several tens of microm- eters or less.

The third conductive pattern MT3 may be disposed over the first conductive pattern MT1 and the second conductive pattern MT2. The third conductive pattern MT3 may cover the first conductive pattern MT1 and the second conductive pattern MT2 such that there is prevented the phenomenon that a light passing through the first conductive pattern MT1 and the second conductive pattern MT2 travels to the first electrode AE1 and may again be incident onto the electronic module CM.

FIG. 9 may be a cross-sectional view of the device area DA taken along line A-A' of FIG. 10.

Referring to FIGS. 9 and 10 together, the reflected light RL according to an embodiment may be incident onto the second conductive pattern MT2 through the following pro- cess: 1) incident onto the second conductive pattern MT2, 2) reflected toward the first conductive pattern MT1, 3) reflected from the first conductive pattern MT1, and 4) incident onto the second conductive pattern MT2. However, the path and incident points of the reflected light RL are not limited to the embodiment of FIG. 9.

In the case where the reflected light RL is trapped between the second conductive pattern MT2 and the first conductive pattern MT1, the amount of reflected light RL incident onto the electronic module CM may be minimized. Also, because the third conductive pattern MT3 covers the first and second conductive patterns MT1 and MT2, the reflected light RL that is not reflected from the first and second conductive patterns MT1 and MT2 may be reflected from the third conductive pattern MT3 so as to be again incident onto the first conductive pattern MT1 or the second conductive pattern MT2. This may mean that the reliability of the electronic module CM is improved.

Also, as illustrated in FIG. 10, because the first conductive pattern MT1 and the second conductive pattern MT2 may be disposed to cross each other in a plan view, the amount of reflected light RL that arrives at the third conductive pattern MT3 through the first conductive pattern MT1 and the second conductive pattern MT2 may decrease, for example, the amount of reflected light RL may decrease to 50%. However, the decrement of the light amount may not be limited thereto. For example, the amount of reflected light RL may decrease to less than 50% or greater than 50%, depending on a width and a separation spacing associated with the first conductive pattern MT1 and the second con- ductive pattern MT2. As such, the amount of reflected light RL that arrives at the electronic module CM may decrease, or there may be no reflected light RL incident onto the electronic module CM.

A reflection path of the reflected light RL will be described with reference to FIGS. 11A and 11B.

Figure 11A:
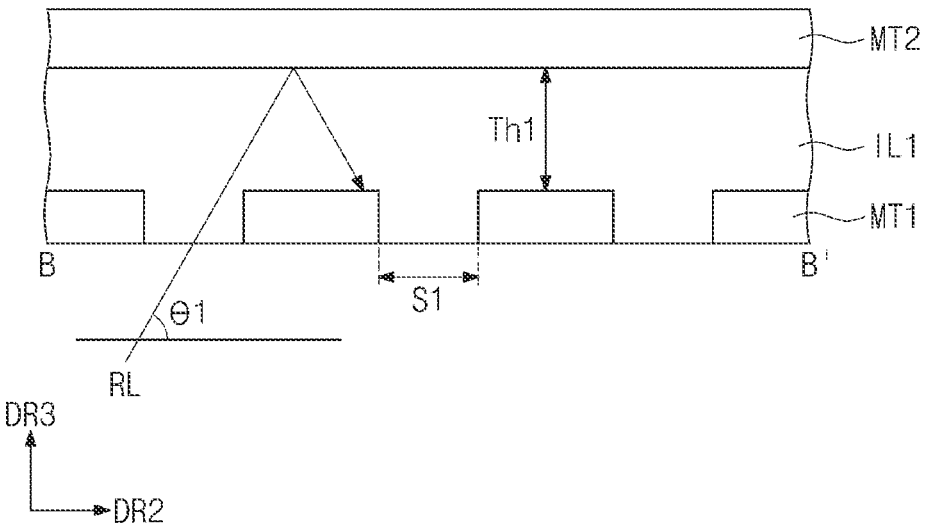
FIG. 11A is a schematic cross-sectional view of a device area taken along line B-B' of FIG. 10.

FIG. 11A is a schematic cross-sectional view of the device area DA taken along line B-B' of FIG. 10. FIG. 11B is a schematic cross-sectional view of the device area DA taken along line C-C' of FIG. 10.

A cross-sectional view of the first conductive pattern MT1 and the second conductive pattern MT2 taken along line B-B' of FIG. 10 is illustrated in FIG. 11A. An intermediate insulating layer IL1 may be interposed between the first conductive pattern MT1 and the second conductive pattern MT2. In an embodiment, the intermediate insulating layer IL1 may correspond to the buffer layer bf (refer to FIG. 9).

Referring to FIG. 11A, the reflected light RL may be reflected from the second conductive pattern MT2 and may be incident onto the first conductive pattern MT1. In detail, in case that a separation spacing associated with the first conductive pattern MT1, for example, the first spacing S1≈(Th1×2)/tan θ1 (Th1 indicating a thickness between the first conductive pattern MT1 and the second conductive pattern MT2), the reflected light RL may be reflected from the second conductive pattern MT2 and may be incident onto the first conductive pattern MT1. Herein, θ1 may be an angle that an incident path of the reflected light RL and a surface parallel to a lower surface of the first conductive pattern MT1 form. The first spacing S1 may be set in consideration of θ1 and Th1 (i.e., the first thickness).

Afterwards, the reflected light RL may be trapped between the first conductive pattern MT1 and the second conductive pattern MT2 while the reflected light RL again travels from the first conductive pattern MT1 to the second conductive pattern MT2. As such, the amount of reflected light RL incident onto the electronic module CM (refer to FIG. 9) may be minimized.

Figure 11B:
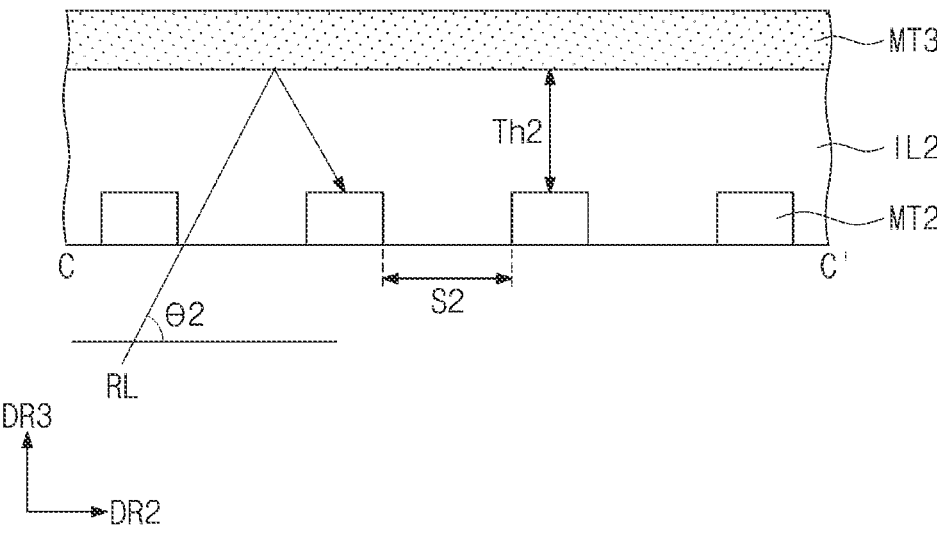
FIG. 11B is a schematic cross-sectional view of a device area taken along line C-C' of FIG. 10.

A cross-sectional view of the second conductive pattern MT2 and the third conductive pattern MT3 taken along line C-C' of FIG. 10 is illustrated in FIG. 11B. An intermediate insulating layer IL2 may be interposed between the second conductive pattern MT2 and the third conductive pattern MT3. In an embodiment, the intermediate insulating layer IL2 may correspond to the second insulating layer 20 (refer to FIG. 9).

Referring to FIG. 11B, the reflected light RL may be reflected from the third conductive pattern MT3 and may be incident onto the second conductive pattern MT2. In detail, in case that a separation spacing associated with the second conductive pattern MT2, for example, the second spacing S2≈(Th2×2)/tan θ2) (Th2 indicating a thickness between the second conductive pattern MT2 and the third conductive pattern MT3), the reflected light RL may be reflected from the third conductive pattern MT3 and may be incident onto the second conductive pattern MT2. Herein, θ2 may be an angle that an incident path of the reflected light RL and a surface parallel to a lower surface of the second conductive pattern MT2 form. The second spacing S2 may be set in consideration of θ2 and Th2 (i.e., the second thickness).

Afterwards, the reflected light RL may be trapped between the second conductive pattern MT2 and the third conductive pattern MT3 while the reflected light RL again travels from the second conductive pattern MT2 to the third conductive pattern MT3. As such, the amount of reflected light RL incident onto the electronic module CM (refer to FIG. 9) may be minimized.

Figure 12:
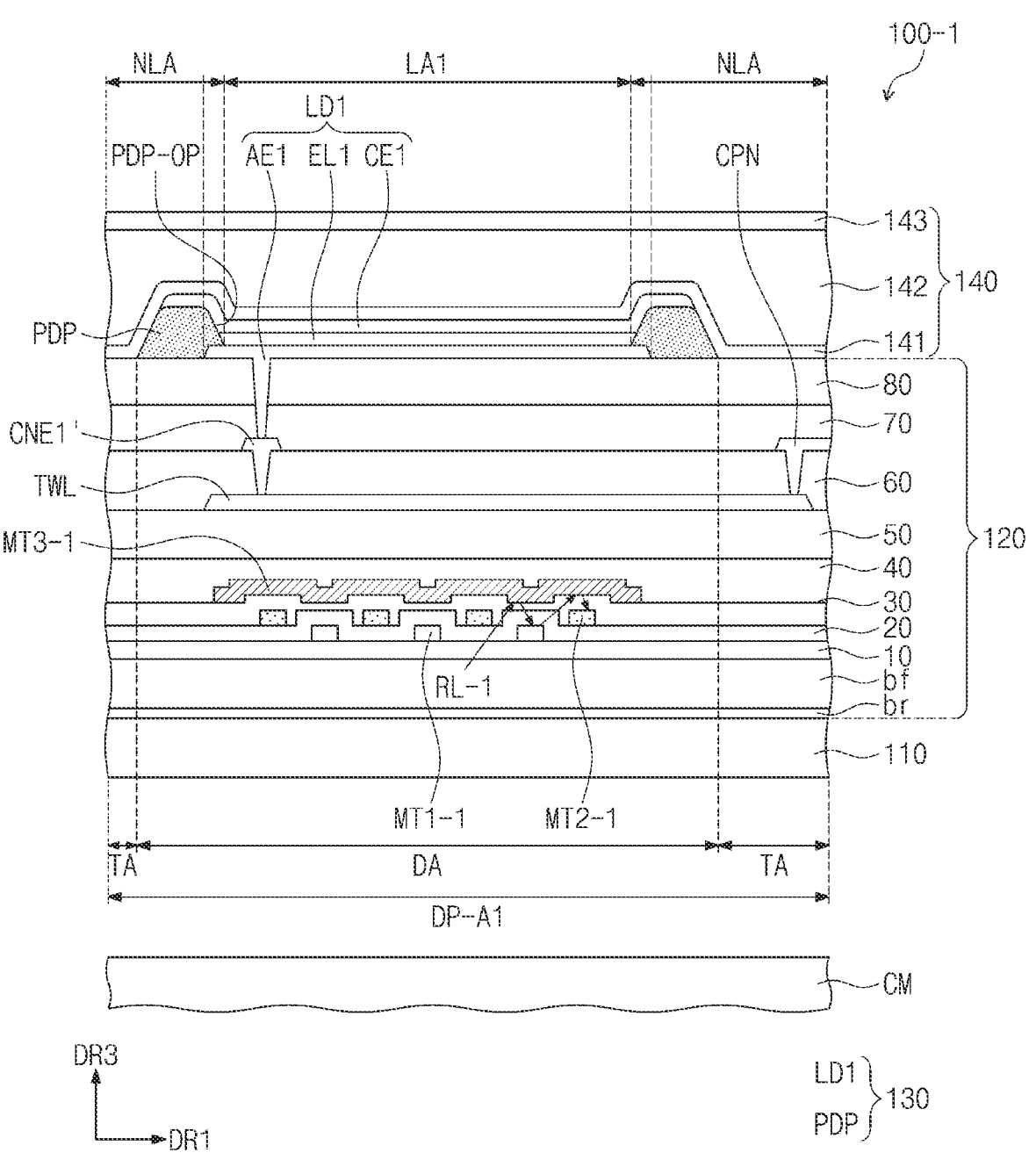
FIG. 12 is a schematic cross-sectional view of a display panel according to an embodiment of the disclosure.

FIG. 12 is a schematic cross-sectional view of a display panel 100-1 according to an embodiment of the disclosure. The above-described content may be applied to components described with reference to FIGS. 1 to 10 from among components illustrated in FIG. 12, and thus, additional description will be omitted to avoid redundancy.

Referring to FIG. 12, the display panel 100-1 according to an embodiment may include a first conductive pattern MT1-1, a second conductive pattern MT2-1, and a third conductive pattern MT3-1 that are disposed in the first area DP-A1. In a plan view, the first to third conductive patterns MT1-1, MT2-1, and MT3-1 may overlap the device area DA and may not overlap the transparent area TA.

In a plan view, the first to third conductive patterns MT1-1, MT2-1, and MT3-1 overlap the first light emitting device LD1, in detail, overlap the first electrode AE1 of the first light emitting device LD1.

Locations of the first to third conductive patterns MT1-1, MT2-1, and MT3-1 included in the display panel 100-1 of FIG. 12 may be different from the locations of the first to third conductive patterns MT1, MT2, and MT3 included in the display panel 100 of FIG. 9. In the display panel 100-1 according to an embodiment, the first conductive pattern MT1-1 may be interposed between the first insulating layer 10 and the second insulating layer 20. The first conductive pattern MT1-1 and the gate GT1 of the silicon thin film transistor S-TFT may include the same material and may be formed through the same process. The second conductive pattern MT2-1 may be interposed between the second insulating layer 20 and the third insulating layer 30. The third conductive pattern MT3-1 may be interposed between the third insulating layer 30 and the fourth insulating layer 40.

In an embodiment, the first to third conductive patterns MT1-1, MT2-1, and MT3-1 may include a reflective metal. Each of the first to third conductive patterns MT1-1, MT2-1, and MT3-1 may independently include at least one of titanium (Ti), silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), indium tin oxide (ITO), and indium zinc oxide (IZO) but embodiments are not specifically limited thereto.

For example, each of the first to third conductive patterns MT1-1, MT2-1, and MT3-1 may be molybdenum (Mo). However, the disclosure is not limited thereto.

In a plan view, the first and second conductive patterns MT1-1 and MT2-1 may be disposed to cross each other. For example, the first and second conductive patterns MT1-1 and MT2-1 may be disposed to be perpendicular to each other in a plan view. The third conductive pattern MT3-1 may cover the first and second conductive patterns MT1-1 and MT2-1 such that there may be prevented the phenomenon that a reflected light passing through the first and second conductive patterns MT1-1 and MT2-1 travels to the first electrode AE1.

The content about the first to third conductive patterns MT1, MT2, and MT3 described with reference to FIGS. 10, 11A, and 11B may be identically applied to a width and a separation spacing associated with each of the first to third conductive patterns MT1-1, MT2-1, and MT3-1.

Referring to FIG. 12, according to an embodiment, a reflected light RL-1 that is reflected from the electronic module CM may be incident onto the third conductive pattern MT3-1 and may be reflected in the order of the first conductive pattern MT1-1, the third conductive pattern MT3-1, and the second conductive pattern MT2-1. According to the above description, the reflected light RL-1 may be trapped between the first to third conductive patterns MT1-1, MT2-1, and MT3-1. However, the path and incident points of the reflected light RL-1 are not limited to the embodiment of FIG. 12.

In detail, the reflected light RL-1 may be trapped between the first conductive pattern MT1-1 and the second conductive pattern MT2-1 in case that the condition described with reference to FIG. 11A is satisfied and may be trapped between the second conductive pattern MT2-1 and the third conductive pattern MT3-1 in case that the condition described with reference to FIG. 11B is satisfied.

A light path may be changed while the reflected light RL-1 passes the first conductive pattern MT1-1 and the second conductive pattern MT2-1 disposed to cross each other, and thus, a light amount may gradually decrease.

Accordingly, even though the reflected light RL-1 passes the first to third conductive patterns MT1-1, MT2-1, and MT3-1 and may again be incident onto the electronic module CM (refer to FIG. 2), the ghost phenomenon described above may be alleviated.

Figure 13:
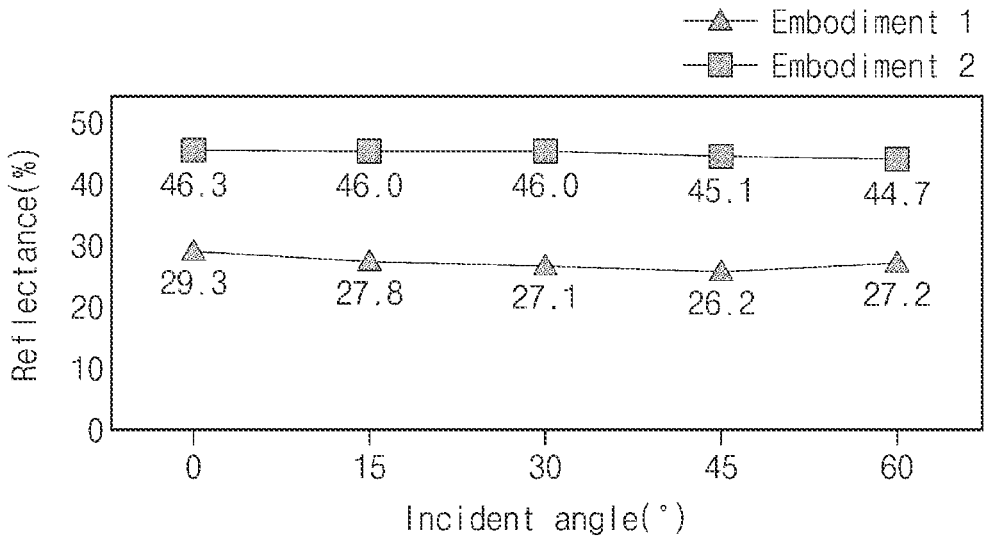
FIG. 13 is a schematic graph illustrating reflectance to an incident angle of an electronic device according to embodiments.

FIG. 13 is a schematic graph illustrating reflectance (%) to an incident angle (°) of an electronic device according to an embodiment 1 and an embodiment 2.

An electronic device according to embodiment 1 may include the first to third conductive patterns MT1, MT2, and MT3 illustrated in FIG. 9. An electronic device according to embodiment 2 may include the first to third conductive patterns MT1-1, MT2-1, and MT3-1 illustrated in FIG. 12.

Also, when FIG. 10 is referenced, embodiment 1 may correspond to an electronic device satisfying the condition that the first width L1=6 μm, the first spacing S1=6 μm, the second width L2=3 μm, and the second spacing S2=9 μm; embodiment 2 may correspond to an electronic device satisfying the condition that the first width L1=3 μm, the first spacing S1=9 μm, the second width L2=3 μm, and the second spacing S2=9 μm.

With regard to embodiment 1 and embodiment 2, it may be confirmed from FIG. 13 that the reflectance in case that the incident angle may be 15°, 30°, 45°, or 60° is lower than the reflectance in case that the incident angle is 0°. Embodiment 1 illustrates the lowest reflectance in case that the incident angle is 45°, and embodiment 2 illustrates the lowest reflectance in case that the incident angle is 60°.

It may be confirmed that the reflectance (%) according to embodiment 1 is lower than the reflectance according to embodiment 2. The reason is that the spacing between the first to third conductive patterns MT1, MT2, and MT3 according to embodiment 1 may be larger than the spacing between the first to third conductive patterns MT1-1, MT2-1, and MT3-1 according to embodiment 2, for example, that a trap space of a reflected light according to embodiment 1 may be larger than a trap space of a reflected light according to embodiment 2.

Compared to the first conductive pattern MT1-1 (refer to FIG. 12) according to embodiment 2, the barrier layer br (refer to FIG. 9) including a silicon oxide (SiOx) layer and an amorphous silicon (a-Si) layer may be disposed under the first conductive pattern MT1 (refer to FIG. 9) according to embodiment 1, and thus, the reflectance of the reflected light may be further reduced.

Accordingly, in the case where an inorganic layer including a silicon oxide (SiOx) layer and an amorphous silicon (a-Si) layer is disposed under each of the first to third conductive patterns MT1, MT2, MT3, MT1-1, MT2-1, and MT3-1 (refer to FIGS. 9 and 12), the reflectance of the reflected lights RL and RL-1 (refer to FIGS. 9 and 12) may be further reduced.

An electronic device according to the disclosure may include a first conductive pattern in a circuit layer, a second conductive pattern crossing the first conductive pattern in a plan view and disposed over the first conductive pattern, and a third conductive pattern covering the first conductive pattern and the second conductive pattern in a plan view. Because the first to third conductive patterns may be disposed to overlap a first electrode of a first light emitting device, the amount of reflected light reflected from an electronic module decreases while passing the first to third conductive patterns before it arrives at a lower surface of the first electrode, or the reflected light may be trapped between the first to third conductive patterns. Accordingly, the amount of light that may be reflected from the first electrode and may be incident onto the electronic module may be minimized. This may mean that the reliability of the electronic module is improved and the reliability of the electronic device is improved.

The reliability of a display panel according to the disclosure may be improved.

An electronic device according to the disclosure may improve the reliability of an electronic module.

While the disclosure has been described with reference to embodiments thereof, it will be apparent to those of ordinary skill in the art that various changes and modifications may be made thereto without departing from the spirit and scope of the disclosure.

What is claimed is:

1. A display panel comprising:
a base layer including a component area;
a circuit layer disposed on the base layer; and
a light emitting device layer including a first light emitting device disposed in the component area, wherein:
the circuit layer includes:
first conductive patterns each extending in a first direction and spaced apart from each other in a second direction intersecting the first direction;
at least one first intermediate insulating layer disposed on the first conductive patterns; and
second conductive patterns disposed on the at least one first intermediate insulating layer and each extending in the second direction, the second conductive patterns being spaced apart from each other in the first direction, and
each of the first conductive patterns and the second conductive patterns overlaps the first light emitting device in a plan view.

2. The display panel of claim 1, wherein
the circuit layer further includes:
at least one second intermediate insulating layer disposed on the second conductive patterns; and
a third conductive pattern disposed on the at least one second intermediate insulating layer, and
each of the first conductive patterns and the second conductive patterns overlaps the third conductive pattern in a plan view.

3. The display panel of claim 2, wherein
the first light emitting device includes a first pixel electrode disposed in the component area,
the component area includes a device area overlapping the first pixel electrode and a transparent area not overlapping the first pixel electrode, and
wherein the first conductive patterns, the second conductive patterns, and the third conductive pattern overlap the first pixel electrode and do not overlap the transparent area.

4. The display panel of claim 3, wherein
the base layer further includes an intermediate area adjacent to the component area,
the light emitting device layer further includes a second light emitting device including a second pixel electrode disposed in the intermediate area,
the circuit layer further includes a first pixel circuit and a second pixel circuit, each of which is disposed in the intermediate area,
the first pixel circuit is electrically connected with the first pixel electrode, and
the second pixel circuit is electrically connected with the second pixel electrode.

5. The display panel of claim 4, wherein
the base layer further includes a main display area adjacent to the intermediate area,
the light emitting device layer further includes a third light emitting device including a third pixel electrode disposed in the main display area,
the circuit layer further includes a third pixel circuit disposed in the main display area, and
wherein the third pixel circuit is electrically connected with the third pixel electrode.

6. The display panel of claim 2, wherein
the circuit layer further includes:
a barrier layer disposed on the base layer and including an inorganic material;
a buffer layer disposed on the barrier layer;
a first insulating layer disposed on the buffer layer;
a second insulating layer disposed on the first insulating layer; and
a third insulating layer disposed on the second insulating layer,
the at least one first intermediate insulating layer includes the buffer layer and the first insulating layer,
the at least one second intermediate insulating layer includes the second insulating layer,
the first conductive patterns are interposed between the barrier layer and the buffer layer,
the second conductive patterns are interposed between the first insulating layer and the second insulating layer, and the third conductive pattern is interposed between the second insulating layer and the third insulating layer.

7. The display panel of claim 6, wherein the barrier layer includes at least one of a silicon oxide layer, a silicon oxynitride layer, a silicon nitride layer, and an amorphous silicon layer.

8. The display panel of claim 2, wherein
the circuit layer further includes:
a barrier layer disposed on the base layer and including an inorganic material;
a buffer layer disposed on the barrier layer;
a first insulating layer disposed on the buffer layer;
a second insulating layer disposed on the first insulating layer;
a third insulating layer disposed on the second insulating layer; and
a fourth insulating layer disposed on the third insulating layer, and
the at least one first intermediate insulating layer includes the second insulating layer,
the first conductive patterns are interposed between the first insulating layer and the second insulating layer, and
wherein the second conductive patterns are interposed between the second insulating layer and the third insulating layer.

9. The display panel of claim 1, wherein
the first conductive patterns are spaced from each other in the second direction as much as a first spacing, and
the first spacing is in a range of plural micrometers to tens of micrometers.

10. The display panel of claim 1, wherein the second conductive patterns are spaced from each other in the first direction as much as a second spacing, and
wherein the second spacing is in a range of plural micrometers to tens of micrometers.

11. The display panel of claim 1, wherein the first direction is perpendicular to the second direction in a plan view.

12. A display panel comprising:
a base layer;
a circuit layer disposed on the base layer; and
a light emitting device layer disposed on the circuit layer, wherein
the circuit layer includes:
first conductive patterns each extending in a first direction on the base layer;
at least one first intermediate insulating layer covering the first conductive patterns;
second conductive patterns disposed on the at least one first intermediate insulating layer and each extending in a second direction intersecting the first direction;
at least one second intermediate insulating layer covering the second conductive patterns; and
a third conductive pattern disposed on the at least one second intermediate insulating layer,
each of the second conductive patterns intersects the first conductive patterns in a plan view, and
each of the first conductive patterns and the second conductive patterns overlaps the third conductive pattern in a plan view.

13. The display panel of claim 12, wherein
the base layer includes a component area including a device area and a transparent area through which a light passes,
the light emitting device layer includes a first light emitting device overlapping the device area, and the first conductive patterns, the second conductive patterns, and the third conductive pattern are disposed in the device area.

14. The display panel of claim 13, wherein
the first light emitting device includes:
a first pixel electrode;
a pixel defining pattern exposing at least a portion of the first pixel electrode;
a light emitting layer disposed on the first pixel electrode; and
a second pixel electrode disposed on the light emitting layer, and
each of the first pixel electrode, the pixel defining pattern, and the light emitting layer overlaps the device area and does not overlap the transparent area.

15. The display panel of claim 13, wherein
the base layer further includes an intermediate area surrounding at least a portion of the component area,
the light emitting device layer further includes a second light emitting device disposed in the intermediate area, and
the circuit layer further includes:
a first pixel circuit disposed in the intermediate area and electrically connected with the first light emitting device; and
a second pixel circuit disposed in the intermediate area and electrically connected with the second light emitting device.

16. The display panel of claim 15, wherein
the base layer further includes a main display area surrounding at least a portion of the intermediate area,
the light emitting device layer further includes a third light emitting device disposed in the main display area, and
the circuit layer further includes a third pixel circuit disposed in the main display area and electrically connected with the third light emitting device.

17. The display panel of claim 12, wherein
the first conductive patterns are spaced from each other in the second direction as much as a first spacing,
the second conductive patterns are spaced from each other in the first direction as much as a second spacing, and
each of the first spacing and the second spacing is in a range of plural micrometers to tens of micrometers.

18. An electronic device comprising:
a base layer including a component area including a device area and a transparent area;
a light emitting device layer including a first light emitting device overlapping the device area in a plan view; and
a circuit layer including a first conductive pattern, a second conductive pattern, and a third conductive pattern, which are insulated from each other, and interposed between the base layer and the light emitting device layer, wherein
the second conductive pattern intersects the first conductive pattern in a plan view,
the third conductive pattern covers the first conductive pattern and the second conductive pattern in a plan view, and
the first conductive pattern, the second conductive pattern, and the third conductive pattern overlap the device area in a plan view.

19. The electronic device of claim 18, further comprising:
an electronic module overlapping the component area in a plan view.

20. The electronic device of claim 19, wherein the base layer further includes an intermediate area adjacent to the component area and not overlapping the electronic module, the light emitting device layer further includes a second light emitting device disposed in the intermediate area, and the circuit layer further includes:

a first pixel circuit disposed in the intermediate area and electrically connected with the first light emitting device; and a second pixel circuit disposed in the intermediate area and electrically connected with the second light emitting device.

* * * * *